United States Patent
Kim et al.

(10) Patent No.: US 9,467,135 B2
(45) Date of Patent: Oct. 11, 2016

(54) SYSTEM-ON-CHIP INCLUDING BODY BIAS VOLTAGE GENERATOR

(71) Applicants: Sang-Kyu Kim, Seoul (KR); Jae-Jin Park, Seongnam-si (KR); Seung-Hoon Lee, Hwasung (KR)

(72) Inventors: Sang-Kyu Kim, Seoul (KR); Jae-Jin Park, Seongnam-si (KR); Seung-Hoon Lee, Hwasung (KR)

(73) Assignee: SAMSUNG ELECTRONICS CO., LTD., Suwon-Si, Gyeonggi-do (KR)

( * ) Notice: Subject to any disclaimer, the term of this patent is extended or adjusted under 35 U.S.C. 154(b) by 0 days.

(21) Appl. No.: 14/717,379

(22) Filed: May 20, 2015

(65) Prior Publication Data

US 2016/0049928 A1 Feb. 18, 2016

(30) Foreign Application Priority Data

Aug. 14, 2014 (KR) .................. 10-2014-0106127

(51) Int. Cl.
| H03K 17/00 | (2006.01) |
| H03K 17/041 | (2006.01) |
| H03K 17/14 | (2006.01) |
| H03K 17/16 | (2006.01) |

(52) U.S. Cl.
CPC ...... *H03K 17/04106* (2013.01); *H03K 17/145* (2013.01); *H03K 17/162* (2013.01); *H03K 2217/0018* (2013.01)

(58) Field of Classification Search
CPC .................. H03K 2217/0018; H03K 17/302
See application file for complete search history.

(56) References Cited

U.S. PATENT DOCUMENTS

| 4,622,480 A | 11/1986 | Uchimura et al. | |
| 5,717,318 A * | 2/1998 | Matsuda ............... | H02M 3/07 323/273 |
| 5,742,195 A * | 4/1998 | Mizuno .............. | H03K 19/0013 327/332 |
| 5,939,934 A * | 8/1999 | So ....................... | H01L 27/0222 257/E27.016 |
| 5,946,259 A | 8/1999 | Manning et al. | |
| 6,177,831 B1 * | 1/2001 | Yoneda ................. | G11C 5/146 327/537 |
| 6,194,954 B1 | 2/2001 | Kim et al. | |
| 6,605,981 B2 * | 8/2003 | Bryant ................ | H01L 27/0218 327/534 |
| 6,731,158 B1 | 5/2004 | Hass | |
| 6,861,901 B2 * | 3/2005 | Prexl ................... | H03F 3/45475 327/562 |
| 6,943,613 B2 | 9/2005 | Miyazaki et al. | |
| 7,019,576 B1 * | 3/2006 | Sancheti .............. | H03H 11/265 327/261 |
| 7,060,566 B2 * | 6/2006 | Vogelsang .......... | H01L 27/0925 257/299 |

(Continued)

FOREIGN PATENT DOCUMENTS

KR 10-0812086 B1 3/2008

*Primary Examiner* — Thomas J Hiltunen
(74) *Attorney, Agent, or Firm* — Lee & Morse, P.C.

(57) ABSTRACT

A system-on-chip includes a body bias voltage generator having a voltage divider and a filter. The voltage divider includes a switched capacitor circuit and a resistor circuit. The switched capacitor circuit operates based on a first clock signal and a second clock signal. The resistor circuit outputs a first voltage through a first node, which is coupled to the switched capacitor circuit and the resistor circuit. The first and second clock signals have a same frequency. The filter performs a filtering operation on the first voltage to generate a body bias voltage.

20 Claims, 18 Drawing Sheets

(56) References Cited

U.S. PATENT DOCUMENTS

| | | |
|---|---|---|
| 7,425,861 B2 | 9/2008 | Egerer et al. |
| 7,592,832 B2 | 9/2009 | Perisetty |
| 7,616,048 B2 * | 11/2009 | Choi ................... G05F 3/205 327/534 |
| 7,683,682 B1 | 3/2010 | Won et al. |
| 7,760,007 B2 | 7/2010 | Holzmann |
| 7,843,712 B2 | 11/2010 | Lee |
| 8,046,598 B2 | 10/2011 | Lee |
| 8,193,854 B2 * | 6/2012 | Kuang ..................... G05F 3/30 323/312 |
| 8,280,089 B2 * | 10/2012 | Hoevesteen ......... H04R 25/505 381/312 |
| 8,587,365 B1 | 11/2013 | Srinivasa Raghavan et al. |
| 8,629,711 B2 | 1/2014 | Chen |
| 2010/0066436 A1 * | 3/2010 | Lee ....................... H03F 1/0261 327/534 |
| 2012/0025899 A1 * | 2/2012 | Ardehali ............ H03H 11/0433 327/537 |
| 2013/0195291 A1 | 8/2013 | Josefsson |

* cited by examiner

SYSTEM-ON-CHIP INCLUDING BODY BIAS VOLTAGE GENERATOR

CROSS-REFERENCE TO RELATED APPLICATION

Korean Patent Application No. 10-2014-0106127, filed on Aug. 14, 2014, and entitled, "System-on-Chip Including Body Bias Voltage Generator," is incorporated by reference herein in its entirety.

BACKGROUND

1. Field

One or more embodiments described herein relate to a system-on-chip including a body bias voltage generator.

2. Description of the Related Art

When the threshold voltage of a metal oxide semiconductor (MOS) transistor (e.g., an n-type MOS transistor) is relatively high, the operational speed of the transistor may decrease because of an increase in signal transfer delay time. Conversely, when the threshold voltage of a MOS transistor is relatively low, an increase in leakage current may occur between the source and drain of the transistor in a cutoff state, e.g., when the voltage between the gate and source is lower than the threshold voltage.

Consequently, in a system-on-chip including a MOS transistor, if the threshold voltage of the transistor is not properly controlled based on an operational frequency of the system-on-chip, the operational speed of the system-on-chip may decrease and/or leakage current of the system-on-chip may increase.

SUMMARY

In accordance with one or more embodiments, a system-on-chip includes a body bias voltage generator which includes: a voltage divider coupled between a supply voltage and a reference voltage, the voltage divider including a switched capacitor circuit to operate based on a first clock signal and a second clock signal, and a resistor circuit to output a first voltage through a first node coupled to the switched capacitor circuit and the resistor circuit, the first clock signal and a second clock signal to have a first frequency; and a filter to perform a filtering operation on the first voltage to generate a body bias voltage. A time duration during which the first clock signal is activated may not overlap a time duration during which the second clock signal is activated.

The voltage divider may increase a magnitude of the first voltage as the first frequency increases, and decrease the magnitude of the first voltage as the first frequency decreases. The switched capacitor circuit may be coupled between the supply voltage and the first node, and the resistor circuit may be coupled between the first node and the reference voltage. The body bias voltage may be coupled to a p-type body on which an n-type metal oxide semiconductor transistor is formed.

The switched capacitor circuit may include a first switch coupled between the supply voltage and a second node, the first switch to be turned on based on the first clock signal; a second switch coupled between the second node and the first node, the second switch to be turned on based on the second clock signal; and a capacitor coupled between the second node and the ground voltage.

The resistor circuit may include first through n-th sub resistors coupled in series between the first node and the ground voltage, n being a positive integer; and first through n-th sub switches coupled to the first through n-th sub resistors, respectively, in parallel, the first through n-th sub switches to be turned on based on first through n-th resistor control signals, respectively.

The resistor circuit may include a switched capacitor to operate based on a third clock signal and a fourth clock signal, the third clock signal and the fourth clock signal are to have a second frequency. The resistor circuit may include a first switch coupled between the first node and a second node, the first switch to be turned on based on the third clock signal; a second switch coupled between the second node and the ground voltage, the second switch to be turned on based on the fourth clock signal; and a capacitor coupled between the second node and the ground voltage.

The voltage divider may decrease a magnitude of the first voltage as the first frequency increases, and increase the magnitude of the first voltage as the first frequency decreases. The switched capacitor circuit may be coupled between the first node and the ground voltage, and the resistor circuit may be coupled between the supply voltage and the first node. The body bias voltage may be coupled to an n-type body on which a p-type metal oxide semiconductor (PMOS) transistor is formed.

The switched capacitor circuit may include a first switch coupled between the first node and a second node, the first switch to be turned on based on the first clock signal; a second switch coupled between the second node and the ground voltage, the second switch to be turned on based on the second clock signal; and a capacitor coupled between the second node and the ground voltage.

The resistor circuit may include first through n-th sub resistors coupled in series between the supply voltage and the first node, n being a positive integer; and first through n-th sub switches coupled to the first through n-th sub resistors, respectively, in parallel, the first through n-th sub switches to be turned on based on first through n-th resistor control signals, respectively.

The resistor circuit may include a switched capacitor to operate based on a third clock signal and a fourth clock signal, and the third clock signal and a fourth clock signal may have a second frequency. The resistor circuit may include a first switch coupled between the supply voltage and a second node, the first switch to be turned on based on the third clock signal; a second switch coupled between the second node and the first node, the second switch to be turned on based on the fourth clock signal; and a capacitor coupled between the second node and the ground voltage.

The system-on-chip may include a non-overlapping clock signal generator to receive a system clock signal having the first frequency, and to generate the first clock signal and the second clock signal based on the system clock signal, wherein a time duration during which the first clock signal is activated does not overlap a time duration during which the second clock signal is activated.

The system-on-chip may include a buffer to buffer the body bias voltage generated by the filter and to output the body bias voltage. A resistance of the resistor circuit may be varied based on a resistor control signal.

In accordance with one or more embodiments, a system-on-chip includes a body bias voltage generator including: a first switched capacitor circuit coupled between a supply voltage and a first node, the first switched capacitor circuit to operate based on a first clock signal and a second clock signal; a first resistor circuit coupled between the first node and a ground voltage; a first filter configured to perform a filtering operation on a first voltage received through the first node to generate a first body bias voltage; a second resistor circuit coupled between the supply voltage and a second node; a second switched capacitor circuit coupled between the second node and the ground voltage, the second switched capacitor circuit to operate based on the first clock signal and the second clock signal; and a second filter to perform a filtering operation on a second voltage received through the second node to generate a second body bias voltage.

The first body bias voltage may be coupled to a p-type body on which an n-type metal oxide semiconductor transistor is formed, and the second body bias voltage may be coupled to an n-type body on which a p-type metal oxide semiconductor transistor is formed.

In accordance with another embodiment, a system-on-chip includes a system clock signal generator to generate a system clock signal having a first frequency based on a clock control signal; a non-overlapping clock signal generator to generate a first clock signal and a second clock signal based on the system clock signal, the first clock signal and the second clock signal to have the first frequency, a time duration during which the first clock signal is activated to not overlap a time duration during which the second clock signal is activated; a body bias voltage generator coupled between a supply voltage and a reference voltage, the body bias voltage generator to generate a first body bias voltage having a magnitude proportional to the first frequency and a second body bias voltage having a magnitude inversely proportional to the first frequency, the first and second bias voltages to be generated using a switched capacitor operating based on the first clock signal and the second clock signal; and a processing block including at least one n-type metal oxide semiconductor transistor having a threshold voltage to vary based on the first body bias voltage and at least one p-type metal oxide semiconductor transistor having a threshold voltage to vary based on the second body bias voltage.

The body bias voltage generator may include a first switched capacitor circuit coupled between the supply voltage and a first node, the first switched capacitor circuit to operate based on the first clock signal and the second clock signal; a first resistor circuit coupled between the first node and the reference voltage; a first filter to perform a filtering operation on a first voltage received through the first node to generate the first body bias voltage; a second resistor circuit coupled between the supply voltage and a second node; a second switched capacitor circuit coupled between the second node and the reference voltage, the second switched capacitor circuit to operate based on the first clock signal and the second clock signal; and a second filter to perform a filtering operation on a second voltage received through the second node to generate the second body bias voltage.

The body bias voltage generator may include a first buffer to buffer the first body bias voltage provided by the first filter and to provide the first body bias voltage to the processing block; and a second buffer to buffer the second body bias voltage provided by the second filter and to provide the second body bias voltage to the processing block.

The processing block may include at least one p-well on a substrate and to receive the first body bias voltage, and at least one n-well on the substrate and to receive the second body bias voltage, the at least one n-type metal oxide semiconductor transistor is on the at least one p-well, and the at least one p-type metal oxide semiconductor transistor is on the at least one n-well. The processing block may operate in synchronization with the system clock signal.

In accordance with one or more embodiments, a voltage generator includes a switched capacitor circuit to operate based on a first control signal and a second control signal; a resistor circuit coupled to the switched capacitor circuit; and a node coupled between the switched capacitor circuit and the resistor circuit, the node to output a first voltage corresponding to a body bias voltage of at least one transistor, wherein the first control signal is shifted relative to the second control signal and wherein the first voltage is based on a timing of the first control signal and the second control signal. The first and second control signals may be clock signals having first and second frequencies, respectively. The first frequency is substantially equal to the second frequency. The first voltage may increase when the first and second frequencies change.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
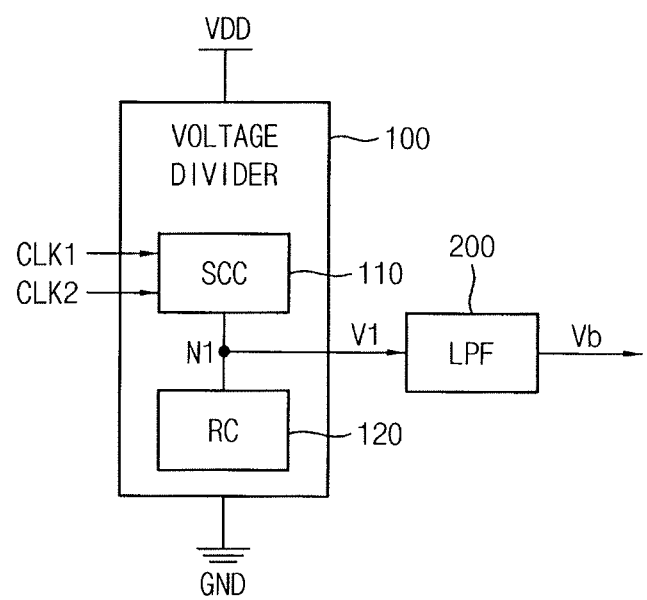
FIG. 1 illustrates an embodiment of a body bias voltage generator.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawings, the dimensions of layers and regions may be exaggerated for clarity of illustration. Like reference numerals refer to like elements throughout. Embodiments may be combined to form additional embodiments.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 illustrates an embodiment of a body bias voltage generator 10 which includes a voltage divider 100 and a filter LPF 200. The voltage divider 100 is coupled between a supply voltage VDD and a reference (e.g., ground) voltage GND. The voltage divider 100 includes a switched capacitor circuit SCC 110 and a resistor circuit RC 120 that are coupled at a first node N1. The switched capacitor circuit 110 operates based on a first clock signal CLK1 and a second clock signal CLK2, both of which have a first frequency. The reference potential may be different from a ground voltage in another embodiment. For example, node N1 may be coupled to the node of another circuit of, for example, a system-on-chip or another circuit in an alternative application.

Figure 2:
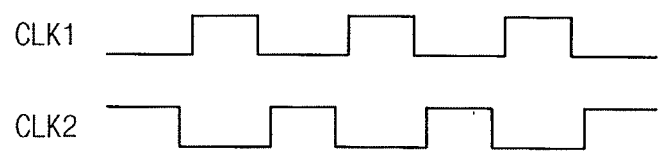
FIG. 2 illustrates an example of signals for the body bias voltage generator.

FIG. 2 illustrates an example of the first clock signal and the second clock signal, which are provided to a switched capacitor circuit in the body bias voltage generator 10. As illustrated in FIG. 2, a time duration during which the first clock signal CLK1 is activated and a time duration during which the second clock signal CLK2 is activated are separated or shifted relative to one another. In one embodiment, these time durations do not overlap. As a result, the switched capacitor circuit 110 may operate as a resistor having a resistance determined based on the first frequency of the first clock signal CLK1 and the second clock signal CLK2.

The first and second clock signals CLK1 and CLK2 may be generated in various ways. For example, the first and second clock signals CLK1 and CLK2 may be generated by different clock circuits or one clock circuit. In the latter case, the second clock signal CLK2 may be generated, for example, by passing the first clock signal CLK1 through an inverter or another circuit that otherwise effectively produces a shift between the first and second clocks signals CLK1 and CLK2. In another embodiment, different types of control signals may be used to operate the switched capacitor circuit 110. For example, control signals having offsetting pulses may be used, which, for example, do not necessarily have a same duty cycle or activation time.

Referring again to FIG. 1, the voltage divider 100 outputs a first voltage V1, which is lower than the supply voltage VDD, through the first node N1. This may be accomplished by dividing the supply voltage VDD based on a ratio between a resistance of the switched capacitor circuit 110 and a resistance of the resistor circuit 120. Therefore, the voltage divider 100 may generate the first voltage V1 having a magnitude that varies based on the first frequency.

The filter 200 performs a filtering operation on the first voltage V1, which is received from the voltage divider 100 through the first node N1, to generate a body bias voltage Vb. In some example embodiments, the filter 200 may be a low-pass filter. In this case, the filter 200 may perform a low-pass filtering operation on the first voltage V1 to generate the body bias voltage Vb. In one embodiment, the filter may be considered optional. In this case, voltage V1 may be the body bias voltage.

Figure 3:
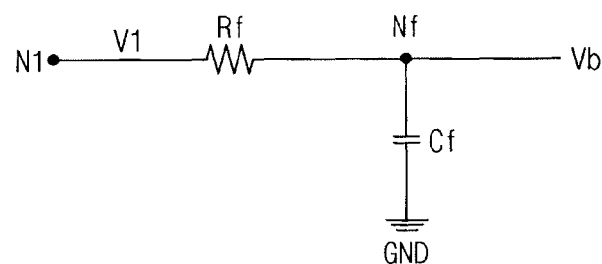
FIG. 3 illustrates an example of a filter.

FIG. 3 illustrates an example of a filter 200 in the body bias voltage generator 10 of FIG. 1. In FIG. 3, the filter 200 is illustrated as a low-pass filter 200a which includes a filter resistor Rf and a filter capacitor Cf. The filter resistor Rf is coupled between the first node N1 and a filter node Nf. The filter capacitor Cf is coupled between the filter node Nf and the ground voltage GND.

As a frequency of an input signal of the low-pass filter 200a increases, the impedance of the filter capacitor Cf decreases. On the other hand, as the frequency of the input signal of the low-pass filter 200a decreases, the impedance of the filter capacitor Cf increases. Therefore, the low-pass filter 200a may filter out a high frequency element included in the first voltage V1, which is received through the first node N1, to generate the body bias voltage Vb.

The low-pass filter 200a is one example of the filter 200 in the body bias voltage generator 10 of FIG. 1. In another embodiment, the filter 200 may include, for example, a band pass filter or another type of filter.

Since the switched capacitor circuit 110 operates based on the first clock signal CLK1 and the second clock signal CLK2, the first voltage V1 generated by the voltage divider 100 may include a ripple corresponding to the first frequency. The filter 200 may filter out a high frequency element included in the first voltage V1, such that the filter 200 may generate the body bias voltage Vb having a substantially constant magnitude.

As described above, the body bias voltage generator 10 may generate the body bias voltage Vb having a magnitude which varies based on the first frequency of the first clock signal CLK1 and the second clock signal CLK2. The body bias voltage Vb generated by the body bias voltage generator 10 may be used in a variety of contexts or applications for providing a bias voltage. In one non-limiting embodiment, the body bias voltage generator 10 may provide the body bias voltage Vb to a body of a metal oxide semiconductor (MOS) transistor in the system-on-chip, and the threshold voltage of the MOS transistor may be adjusted based on the body bias voltage Vb.

Figure 4:
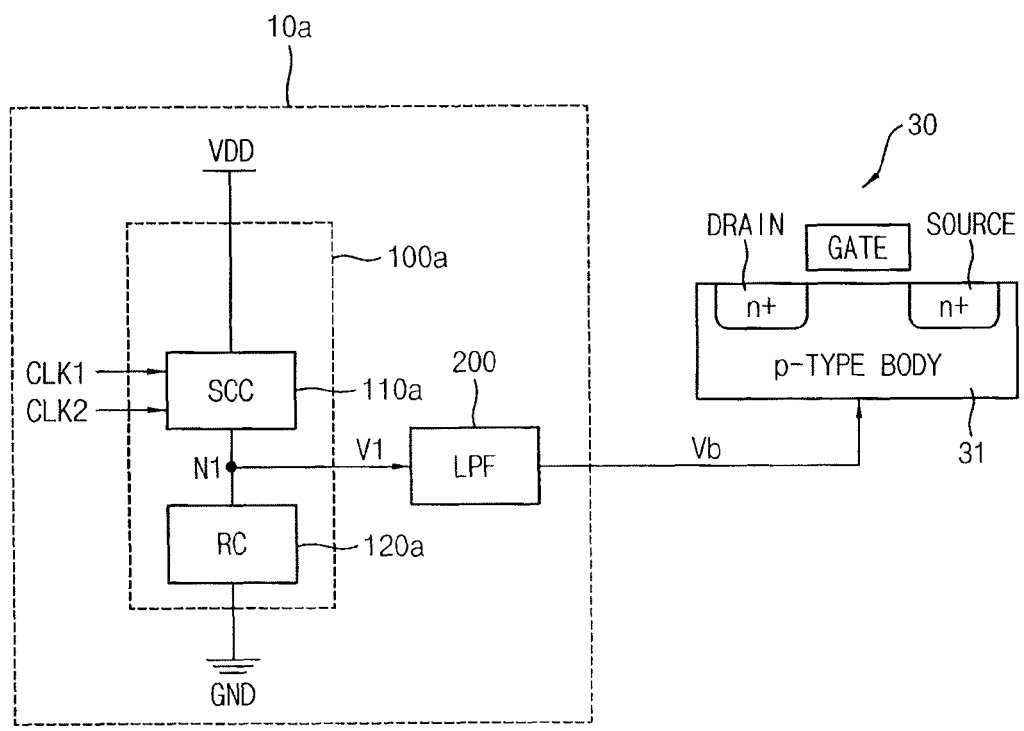
FIG. 4 illustrates another embodiment of the body bias voltage generator.

FIG. 4 illustrates an embodiment of the body bias voltage generator 10a of FIG. 1. Referring to FIG. 4, a body bias voltage generator 10a includes a voltage divider 100a and a filter LPF 200. The voltage divider 100a includes a switched capacitor circuit 110a and a resistor circuit 120a. The switch capacitor circuit 110a is coupled between the supply voltage VDD and the first node N1, and the resistor circuit 120a is coupled between the first node N1 and the ground voltage GND.

As described with reference to FIG. 5, the switched capacitor circuit 110a may operate as a resistor having a resistance that is inversely proportional to the first frequency of the first clock signal CLK1 and the second clock signal CLK2. The resistor circuit 120a may have a substantially constant resistance or a variable resistance. Therefore, as the first frequency increases, the voltage divider 100a may increase the magnitude of the first voltage V1. On the other hand, as the first frequency decreases, the voltage divider 100a may decrease the magnitude of the first voltage V1.

Figure 5:
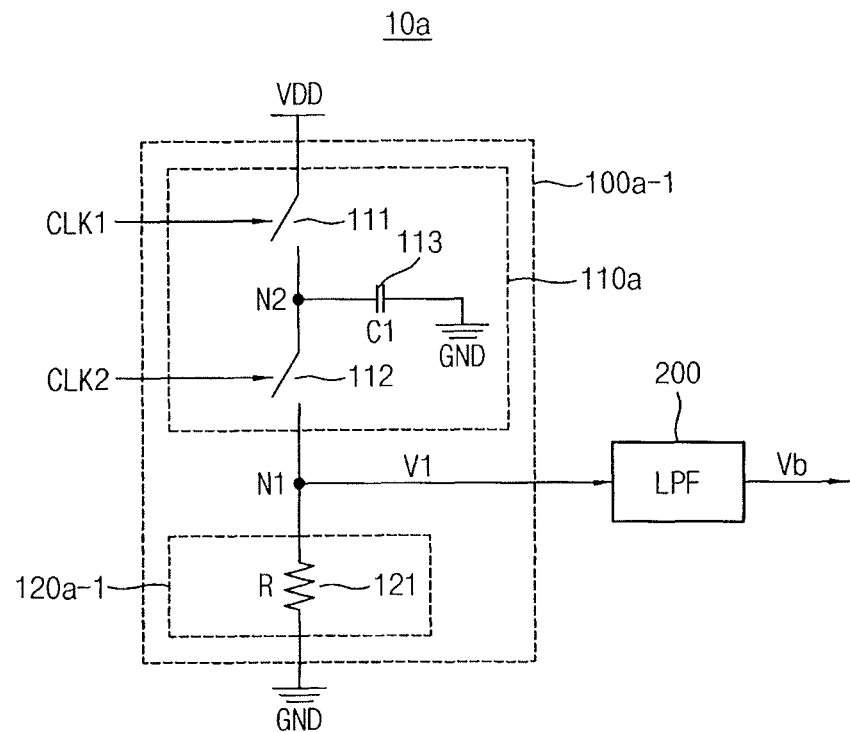
FIG. 5 illustrates an example of a voltage divider.

FIG. 5 illustrates an example of a voltage divider 100a-1 in the body bias voltage generator 10a of FIG. 4. Referring to FIG. 5, the voltage divider 100a-1 includes a switched capacitor circuit 110a and a resistor circuit 120a-1. The switched capacitor circuit 110a includes a first switch 111, a second switch 112, and a first capacitor C1 113. The first switch 111 is coupled between the supply voltage VDD and a second node N2, and is turned on based on the first clock signal CLK1. The second switch 112 is coupled between the second node N2 and the first node N1, and is turned on based on the second clock signal CLK2. The first capacitor 113 is coupled between the second node N2 and the ground voltage GND.

In the embodiments described with reference to FIGS. 1 and 2, the time duration during which the first clock signal CLK1 is activated does not overlap the time duration during which the second clock signal CLK2 is activated.

An amount of charge corresponding to (C1*VDD), which is the product of the capacitance C1 of the first capacitor 113 and the supply voltage VDD, may be stored in the first capacitor 113 while the first switch 111 is turned on and the second switch 112 is turned off. The amount of charge corresponding to (C1*VDD) stored in the first capacitor 113 is transferred to the first node N1 while the first switch 111 is turned off and the second switch 112 is turned on.

Since the first switch 111 and the second switch 112 are alternately turned on based on the first frequency, the amount of charge transferred from the supply voltage VDD to the first node N1 per time period (e.g., one second) may correspond to (C1*VDD*f1), where f1 represents the first frequency. Therefore, the switched capacitor circuit 110a may provide a resistance corresponding to (1/(C1*f1)) between the supply voltage VDD and the first node N1.

The resistor circuit 120a-1 may include a resistor 121 having a constant resistance R. As described with reference to FIG. 5, the switched capacitor circuit 110a may operate as a resistor having a resistance inversely proportional to the first frequency of the first clock signal CLK1 and the second clock signal CLK2. The resistor circuit 120a-1 may include the resistor 121 having constant resistance R. Therefore, as the first frequency increases, the magnitude of the first voltage V1 generated by the voltage divider 100a-1 may increase. On the other hand, as the first frequency decreases, the magnitude of the first voltage V1 generated by the voltage divider 100a-1 may decrease.

Figure 6:
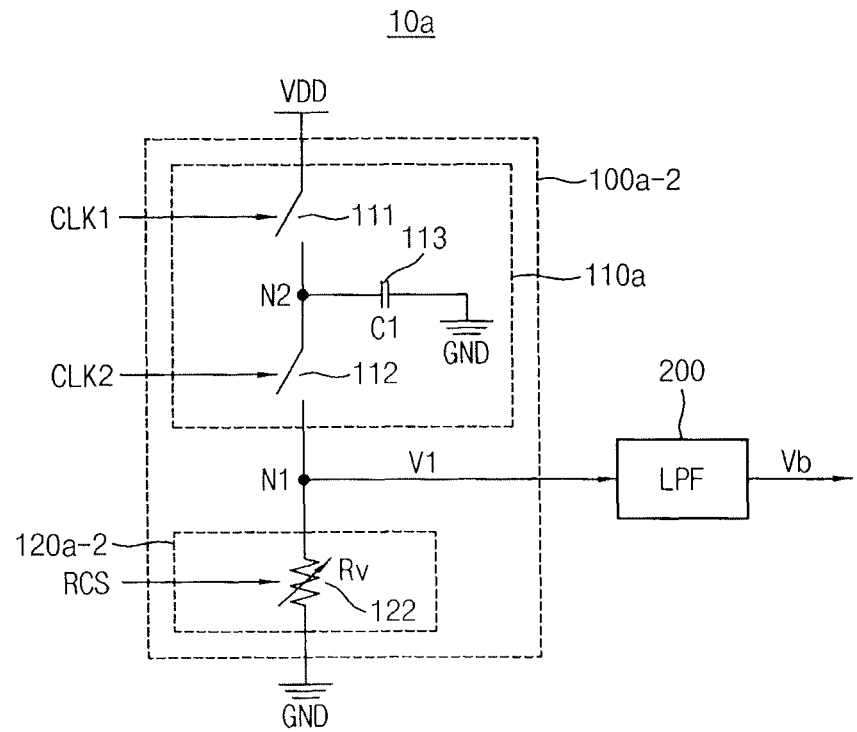
FIG. 6 illustrates another example of a voltage divider.

FIG. 6 illustrates another example of a voltage divider 100a-2 in the body bias voltage generator 10a of FIG. 4. Referring to FIG. 6, the voltage divider 100a-2 includes a switched capacitor circuit 110a and a resistor circuit 120a-2. The switched capacitor circuit 110a in the voltage divider 100a-2 of FIG. 6 may be the same as the switched capacitor circuit 110a in the voltage divider 100a-1 of FIG. 5. The resistor circuit 120a-2 may include a variable resistor 122 having a resistance Rv which varies based on a resistor control signal RCS.

In some example embodiments, the resistor control signal RCS may be provided from a source external to the body bias voltage generator 10a. In other example embodiments, the body bias voltage generator 10a may internally generate the resistor control signal RCS.

As described above, the switched capacitor circuit 110a may operate as a resistor having a resistance inversely proportional to the first frequency of the first clock signal CLK1 and the second clock signal CLK2. Therefore, as the first frequency increases, the magnitude of the first voltage V1 generated by the voltage divider 100a-2 may increase. On the other hand, as the first frequency decreases, the magnitude of the first voltage V1 generated by the voltage divider 100a-2 may decrease.

In addition, since the voltage divider 100a-2 of FIG. 6 includes the variable resistor 122, which has the resistance Rv that varies based on the resistor control signal RCS, the voltage divider 100a-2 may control a range of the magnitude of the first voltage V1, which is varied based on the first frequency, by varying the resistance Rv of the variable resistor 122 based on the resistor control signal RCS.

Figure 7:
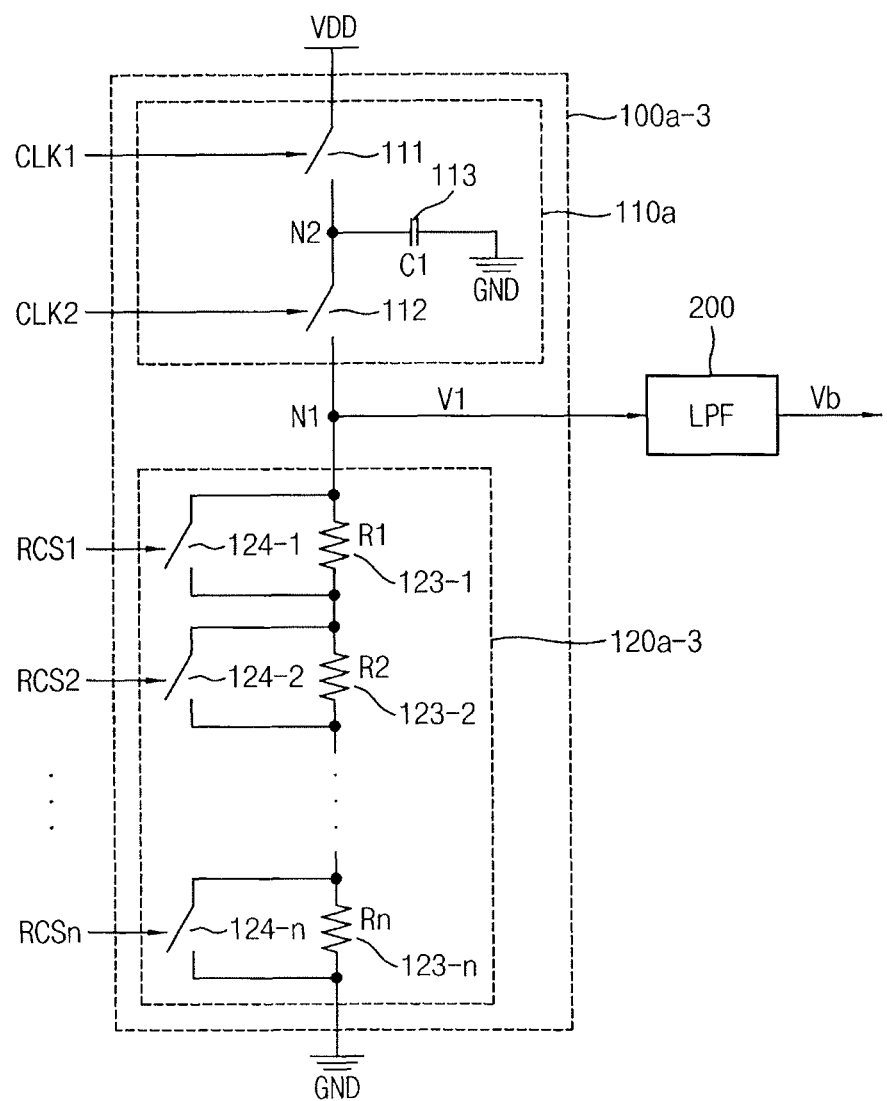
FIG. 7 illustrates another example of a voltage divider.

FIG. 7 illustrates another example of a voltage divider 100a-3 in the body bias voltage generator 10a of FIG. 4. The voltage divider 100a-3 may include a switched capacitor circuit 110a and a resistor circuit 120a-3. The switched capacitor circuit 110a may be the same as in the voltage divider 100a-1 of FIG. 5.

The resistor circuit 120a-3 includes first through n-th sub resistors R1, R2, . . . , Rn 123-1, 123-2, . . . , 123-n, and first through n-th sub switches 124-1, 124-2, . . . , 124-n, where n represents a positive integer equal to or greater than two. As illustrated in FIG. 7, the first through n-th sub resistors 123-1, 123-2, . . . , 123-n may be coupled in series between the first node N1 and the ground voltage GND. The first through n-th sub switches 124-1, 124-2, . . . , 124-n may be coupled to the first through n-th sub resistors 123-1, 123-2, . . . , 123-n, respectively, in parallel. The first through n-th sub switches 124-1, 124-2, . . . , 124-n may be turned on based on first through n-th resistor control signals RCS1, RCS2, . . . , RCSn, respectively. Therefore, the resistor circuit 120a-3 may provide a resistance, which varies based on the first through n-th resistor control signals RCS1, RCS2, . . . , RCSn, between the first node N1 and the ground voltage GND.

In some example embodiments, the first through n-th resistor control signals RCS1, RCS2, . . . , RCSn may be provided from a source external to the body bias voltage generator 10a. In other example embodiments, the body bias voltage generator 10a may internally generate the first through n-th resistor control signals RCS1, RCS2, . . . , RCSn.

As described above, the switched capacitor circuit 110a operates as a resistor having a resistance inversely proportional to the first frequency of the first clock signal CLK1 and the second clock signal CLK2. Therefore, as the first frequency increases, the magnitude of the first voltage V1 generated by the voltage divider 100a-3 may increase. On the other hand, as the first frequency decreases, the magnitude of the first voltage V1 generated by the voltage divider 100a-3 may decrease.

In addition, since the voltage divider 100a-3 of FIG. 7 includes the resistor circuit 120a-3 having a resistance varied based on the first through n-th resistor control signals RCS1, RCS2, . . . , RCSn, the voltage divider 100a-3 may control a range of the magnitude of the first voltage V1, which is varied based on the first frequency, by varying the resistance of the resistor circuit 120a-3 based on the first through n-th resistor control signals RCS1, RCS2, . . . , RCSn.

Figure 8:
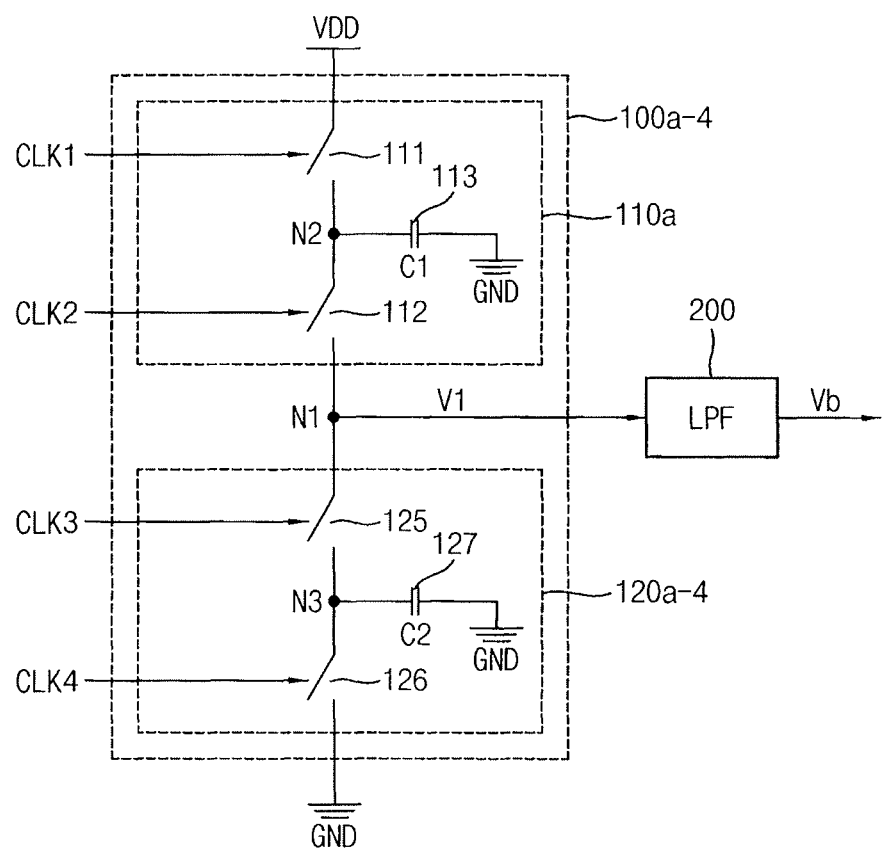
FIG. 8 illustrates another example of a voltage divider.

FIG. 8 illustrates another example of a voltage divider 100a-4 in the body bias voltage generator 10a of FIG. 4. Referring to FIG. 8, a voltage divider 100a-4 may include a switched capacitor circuit 110a and a resistor circuit 120a-4. The switched capacitor circuit 110a may be the same as the switched capacitor circuit 110a included in the voltage divider 100a-1 of FIG. 5.

The resistor circuit 120a-4 includes a switched capacitor operating based on a third clock signal CLK3 and a fourth clock signal CLK4, both of which have a second frequency. For example, as illustrated in FIG. 8, the resistor circuit 120a-4 may include a third switch 125, a fourth switch 126, and a second capacitor C2 127. The third switch 125 is coupled between the first node N1 and a third node N3, and is turned on based on the third clock signal CLK3. The fourth switch 126 is coupled between the third node N3 and the ground voltage GND, and is turned on based on the fourth clock signal CLK4. The second capacitor 127 is coupled between third node N3 and ground voltage GND.

A time duration during which the third clock signal CLK3 is activated and a time duration during which the fourth clock signal CLK4 is activated are separated. For example, the time duration during which the third clock signal CLK3 is activated does not overlap the time duration during which the fourth clock signal CLK4 is activated. Therefore, the third switch 125 and the fourth switch 126 may be alternately turned on with the second frequency.

Therefore, in a way similar to the switched capacitor circuit 110a, the resistor circuit 120a-4 may provide a resistance corresponding to (1/(C2*f2)) between the first node N1 and the ground voltage GND, where C2 represents a capacitance of the second capacitor 127 and f2 represents the second frequency. Thus, the resistor circuit 120a-4 provides a resistance, which is varied based on the second frequency, between the first node N1 and the ground voltage GND.

As described above, the switched capacitor circuit 110a may operate as a resistor having a resistance inversely proportional to the first frequency of the first clock signal CLK1 and the second clock signal CLK2. Therefore, as the first frequency increases, the magnitude of the first voltage V1 generated by the voltage divider 100a-4 may increase. On the other hand, as the first frequency decreases, the magnitude of the first voltage V1 generated by the voltage divider 100a-4 may decrease.

In addition, the voltage divider 100a-4 of FIG. 8 includes the resistor circuit 120a-4 having a resistance which varies based on the second frequency of the third clock signal CLK3 and the fourth clock signal CLK4. As a result, the voltage divider 100a-4 may control the range of magnitude of the first voltage V1, which is varied based on the first frequency, by varying the resistance of the resistor circuit 120a-4 based on the second frequency of the third clock signal CLK3 and the fourth clock signal CLK4.

Referring again to FIG. 4, the filter 200 may perform a low-pass filtering operation on the first voltage V1, received from the voltage divider 100a through the first node N1, to generate the body bias voltage Vb. In one embodiment, as illustrated in FIG. 4, the body bias voltage Vb generated by the body bias voltage generator 10a may be provided to a p-type body 31 on which an n-type metal oxide semiconductor (NMOS) transistor 30 is formed.

As described with reference to FIG. 20, the body bias voltage generator 10a may further include a buffer that buffers the body bias voltage Vb generated by the filter 200. In this case, the body bias voltage Vb from the buffer may be provided to the p-type body 31 on which the NMOS transistor 30 is formed.

As described with reference to FIGS. 4 to 8, as the first frequency of the first clock signal CLK1 and the second clock signal CLK2 increases, the magnitude of the body bias voltage Vb generated by the body bias voltage generator 10a may increase. On the other hand, as the first frequency of the first clock signal CLK1 and the second clock signal CLK2 decreases, the magnitude of the body bias voltage Vb generated by the body bias voltage generator 10a may decrease.

When the body bias voltage Vb (which is applied to the p-type body 31 on which the NMOS transistor 30 is formed) increases, the threshold voltage of the NMOS transistor 30 may decrease. When the body bias voltage Vb (which is applied to this p-type body 31) decreases, the threshold voltage of the NMOS transistor 30 may increase.

When the threshold voltage of the NMOS transistor 30 decreases, the operational speed of the NMOS transistor 30 may increase because the delay time of signal transfer of the NMOS transistor 30 decreases. On the other hand, when the threshold voltage of the NMOS transistor 30 increases, leakage current flowing between the source and drain of the NMOS transistor 30 in a cutoff state may decrease.

Therefore, when the first frequency of the first clock signal CLK1 and the second clock signal CLK2 increase, the body bias voltage generator 10a may increase the operational speed of the NMOS transistor 30. This may be accomplished by increasing the magnitude of the body bias voltage Vb applied to the p-type body 31 on which the NMOS transistor 30 is formed. As a result, the threshold voltage of the NMOS transistor 30 may decrease.

When the first frequency of the first clock signal CLK1 and the second clock signal CLK2 decrease, the body bias voltage generator 10a may decrease the leakage current of the NMOS transistor 30. This may be accomplished by decreasing the magnitude of the body bias voltage Vb applied to the p-type body 31 on which the NMOS transistor 30 is formed. As a result, the threshold voltage of the NMOS transistor 30 may increase. In addition, since the body bias voltage generator 10a is implemented using the switched capacitor circuit 110a, which has a simple structure, the size of the body bias voltage generator 10a may be reduced.

Figure 9:
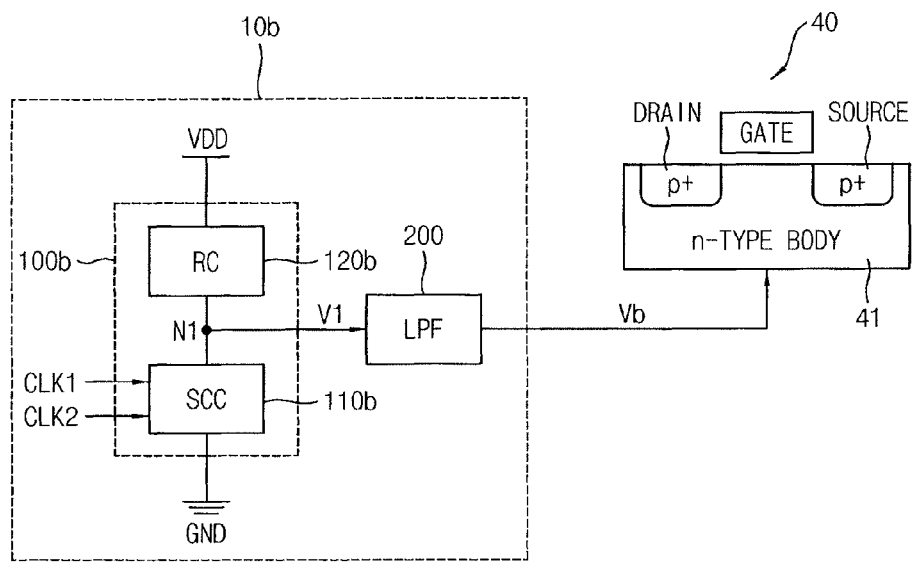
FIG. 9 illustrates another embodiment of a body bias voltage generator.

FIG. 9 illustrates another embodiment of a body bias voltage generator 10b of FIG. 1. Referring to FIG. 9, a body bias voltage generator 10b includes a voltage divider 100b and a filter LPF 200. The voltage divider 100b includes a switched capacitor circuit 110b and a resistor 120b. The switched capacitor circuit 110b is coupled between the first node N1 and the ground voltage GND. The resistor circuit 120b is coupled between the supply voltage VDD and the first node N1.

As described with reference to FIG. 10, the switched capacitor circuit 110b may operate as a resistor having a resistance inversely proportional to the first frequency of the first clock signal CLK1 and the second clock signal CLK2. According to example embodiments, the resistor circuit 120b may have a substantially constant resistance or a variable resistance. Therefore, as the first frequency increases, the voltage divider 100b may decrease the magnitude of the first voltage V1. On the other hand, as the first frequency decreases, the voltage divider 100a may increase the magnitude of the first voltage V1.

Figure 10:
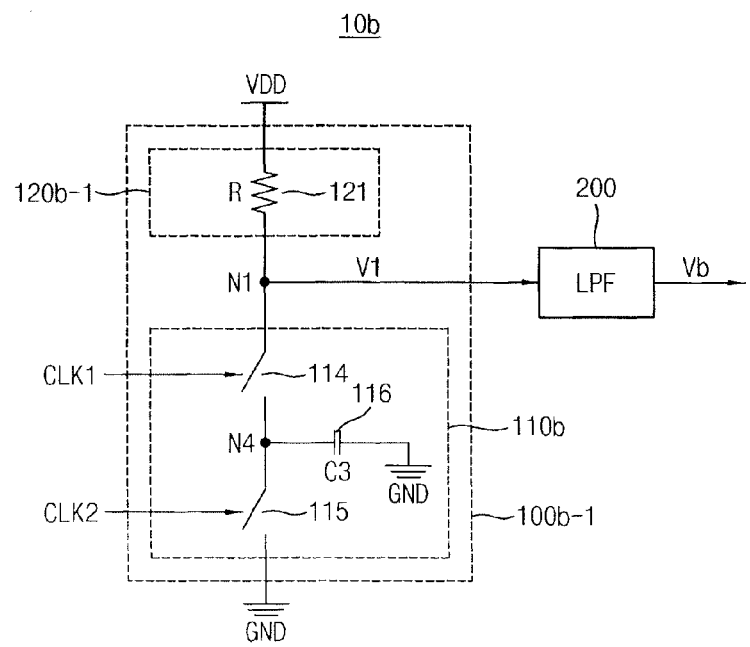
FIG. 10 illustrates another example of a voltage divider.

FIG. 10 illustrates an example of a voltage divider 100b-1 in the body bias voltage generator 10b of FIG. 9. Referring to FIG. 10, the voltage divider 100b-1 includes a switched capacitor circuit 110b and a resistor circuit 120b-1. The switched capacitor circuit 110b includes a fifth switch 114, a sixth switch 115 and a third capacitor C3 116. The fifth switch 114 is coupled between the first node N1 and a fourth node N4 and is turned on based on the first clock signal CLK1. The sixth switch 115 is coupled between the fourth node N4 and the ground voltage GND and is turned on based on the second clock signal CLK2. The third capacitor 116 is coupled between the fourth node N4 and the ground voltage GND.

As described with reference to FIGS. 1 and 2, the time duration during which the first clock signal CLK1 is activated does not overlap the time duration during which the second clock signal CLK2 is activated.

The amount of charges corresponding to (C3*V1), which is the product of a capacitance C3 of the third capacitor 116 and the first voltage V1, may be stored in the third capacitor 116 while the fifth switch 114 is turned on and the sixth switch 115 is turned off. The amount of charge corresponding to (C3*V1) stored in the third capacitor 116 may be transferred to the ground voltage GND while the fifth switch 114 is turned off and the sixth switch 115 is turned on.

Since the fifth switch 114 and the sixth switch 115 are alternately turned on with the first frequency, the amount of charge transferred from the first node N1 to the ground voltage GND per unit time (e.g., in a second) may correspond to (C3*V1*f1), where f1 represents the first frequency. Therefore, the switched capacitor circuit 110b may provide a resistance corresponding to (1/(C3*f1)) between the first node N1 and the ground voltage GND. The resistor circuit 120b-1 may include a resistor 121 having a constant resistance R.

As described above with reference to FIG. 10, the switched capacitor circuit 110b may operate as a resistor having a resistance inversely proportional to the first frequency of the first clock signal CLK1 and the second clock signal CLK2. The resistor circuit 120b-1 may be implemented with the resistor 121 having the constant resistance R. Therefore, as the first frequency increases, the magnitude of the first voltage V1 generated by the voltage divider 100b-1 may decrease. On the other hand, as the first frequency decreases, the magnitude of the first voltage V1 generated by the voltage divider 100b-1 may increase.

Figure 11:
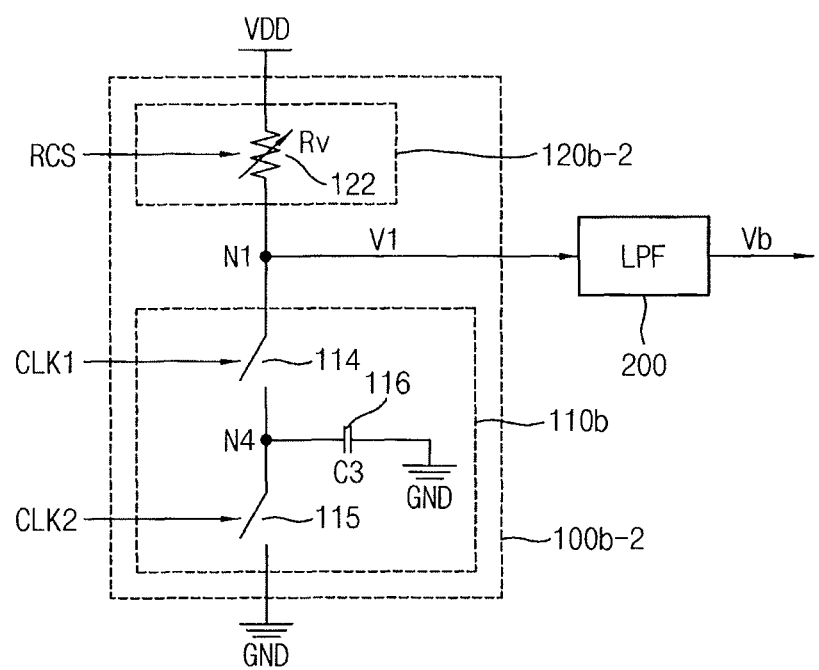
FIG. 11 illustrates another example of a voltage divider.

FIG. 11 illustrates another example of a voltage divider 100b-2 in the body bias voltage generator 10b of FIG. 9. Referring to FIG. 11, the voltage divider 100b-2 may include a switched capacitor circuit 110b and a resistor circuit 120b-2. The switched capacitor circuit 110b may be the same as the switched capacitor circuit 110b included in the voltage divider 100b-1 of FIG. 10. The resistor circuit 120b-2 may include a variable resistor 122 having a resistance Rv varied based on a resistor control signal RCS. In some example embodiments, the resistor control signal RCS may be provided from an external source outside of the body bias voltage generator 10b. In other example embodiments, the body bias voltage generator 10b may internally generate the resistor control signal RCS.

As described above, the switched capacitor circuit 110b may operate as a resistor having a resistance inversely proportional to the first frequency of the first clock signal CLK1 and the second clock signal CLK2. Therefore, as the first frequency increases, the magnitude of the first voltage V1 generated by the voltage divider 100b-2 may decrease. On the other hand, as the first frequency decreases, the magnitude of the first voltage V1 generated by the voltage divider 100b-2 may increase.

In addition, the voltage divider 100b-2 of FIG. 11 includes the variable resistor 122, which has the resistance Rv varied based on the resistor control signal RCS. As a result, the voltage divider 100b-2 may control the range of the magnitude of the first voltage V1, which is varied based on the first frequency, by varying the resistance Rv of the variable resistor 122 based on the resistor control signal RCS.

Figure 12:
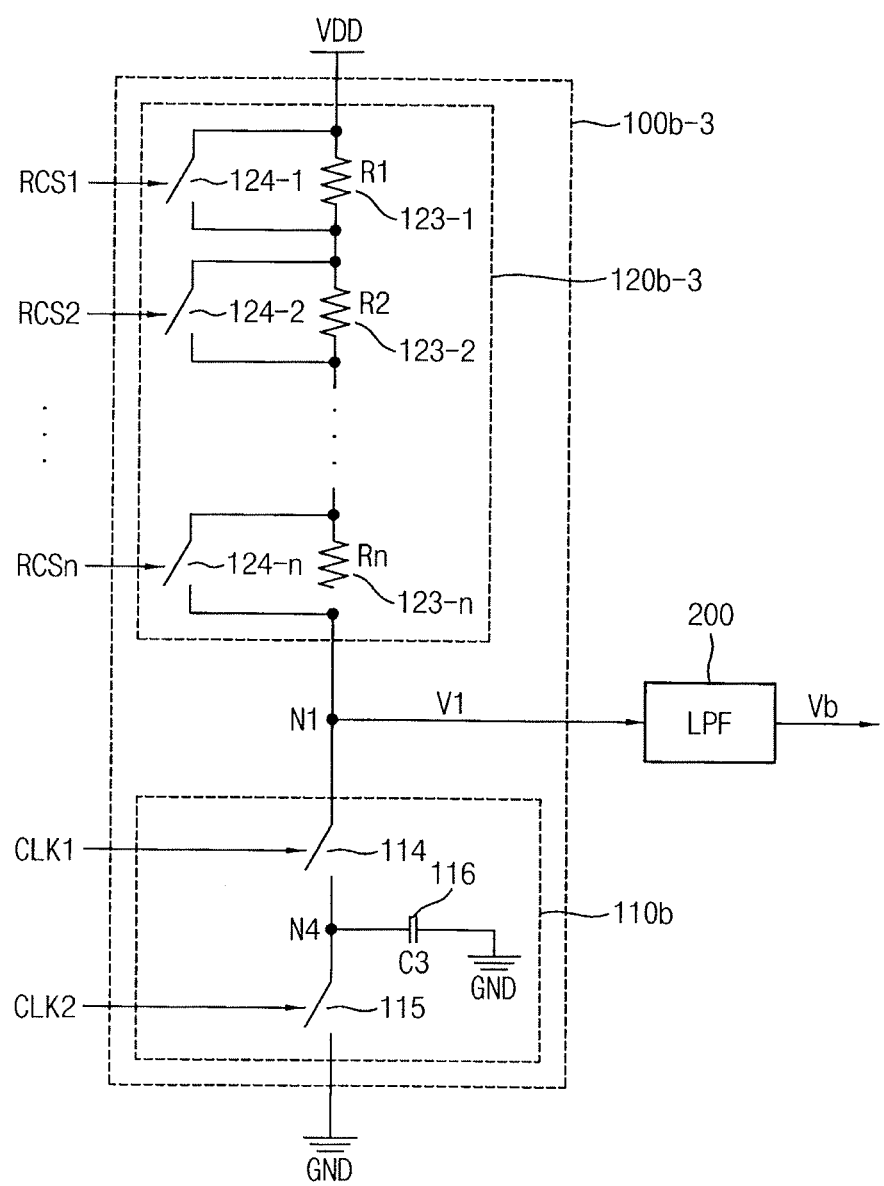
FIG. 12 illustrates another example of a voltage divider.

FIG. 12 illustrating another example of a voltage divider 100b-3 in the body bias voltage generator 10b of FIG. 9. Referring to FIG. 12, the voltage divider 100b-3 may include a switched capacitor circuit 110b and a resistor circuit 120b-3. The switched capacitor circuit 110b may be the same as the switched capacitor circuit 110b included in the voltage divider 100b-1 of FIG. 10. The resistor circuit 120b-3 may include first through n-th sub resistors R1, R2, . . . , Rn 123-1, 123-2, . . . , 123-n, and first through n-th sub switches 124-1, 124-2, . . . , 124-n, where n represents a positive integer equal to or greater than two.

As illustrated in FIG. 12, the first through n-th sub resistors 123-1, 123-2, . . . , 123-n may be coupled in series between the supply voltage VDD and the first node N1. The first through n-th sub switches 124-1, 124-2, . . . , 124-n may be coupled to the first through n-th sub resistors 123-1, 123-2, . . . , 123-n, respectively, in parallel. The first through n-th sub switches 124-1, 124-2, . . . , 124-n may be turned on based on first through n-th resistor control signals RCS1, RCS2, . . . , RCSn, respectively. Therefore, the resistor circuit 120b-3 may provide a resistance, which is varied based on the first through n-th resistor control signals RCS1, RCS2, . . . , RCSn, between the supply voltage VDD and the first node N1.

In some example embodiments, the first through n-th resistor control signals RCS1, RCS2, . . . , RCSn may be provided from a source outside of the body bias voltage generator 10b. In other example embodiments, the body bias voltage generator 10b may internally generate the first through n-th resistor control signals RCS1, RCS2, . . . , RCSn.

As described above, the switched capacitor circuit 110b may operate as a resistor having a resistance inversely proportional to the first frequency of the first clock signal CLK1 and the second clock signal CLK2. Therefore, as the first frequency increases, the magnitude of the first voltage V1 generated by the voltage divider 100b-3 may decrease. On the other hand, as the first frequency decreases, the magnitude of the first voltage V1 generated by the voltage divider 100b-3 may increase.

In addition, the voltage divider 100*b*-3 of FIG. 12 includes the resistor circuit 120*b*-3 having a resistance varied based on the first through n-th resistor control signals RCS1, RCS2, . . . , RCSn. As a result, the voltage divider 100*b*-3 may control the range of the magnitude of the first voltage V1, which is varied based on the first frequency, by varying the resistance of the resistor circuit 120*b*-3 based on the first through n-th resistor control signals RCS1, RCS2, . . . , RCSn.

Figure 13:
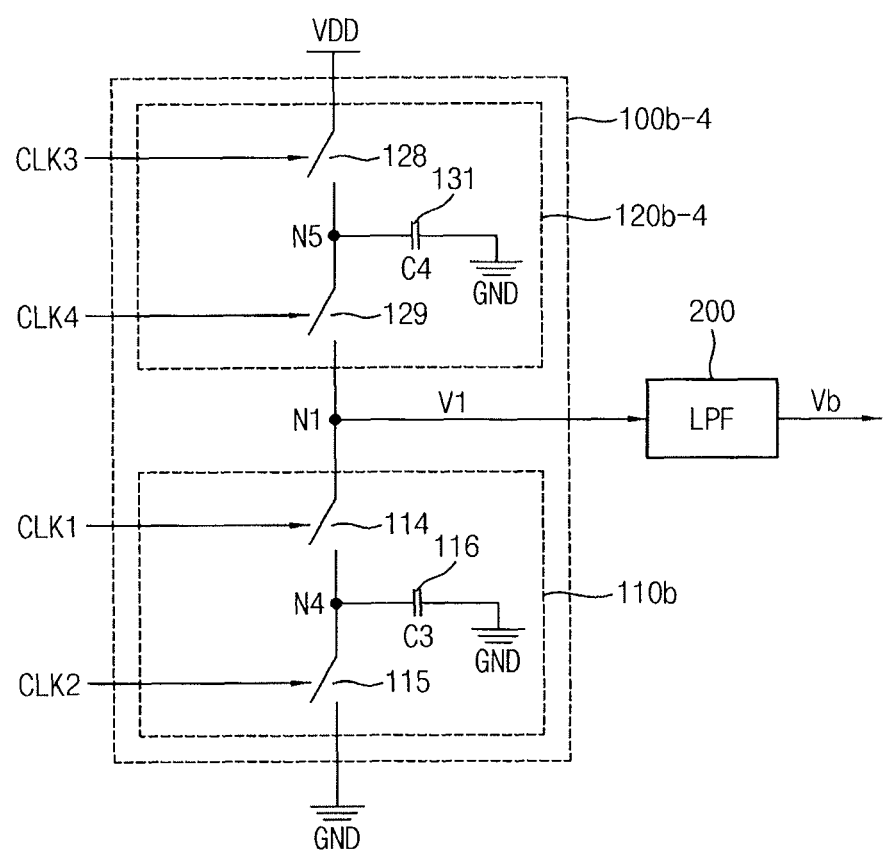
FIG. 13 illustrates another example of a voltage divider.

FIG. 13 illustrates another example of a voltage divider 100*b*-4 in the body bias voltage generator 10*b* of FIG. 9. Referring to FIG. 13, the voltage divider 100*b*-4 may include a switched capacitor circuit 110*b* and a resistor circuit 120*b*-4. The switched capacitor circuit 110*b* may be the same as the switched capacitor circuit 110*b* included in the voltage divider 100*b*-1 of FIG. 10.

The resistor circuit 120*b*-4 may include a switched capacitor operating based on a third clock signal CLK3 and a fourth clock signal CLK4, both of which have a second frequency. For example, as illustrated in FIG. 13, the resistor circuit 120*b*-4 includes a seventh switch 128, an eighth switch 129, and a fourth capacitor C4 131. The seventh switch 128 is coupled between the supply voltage VDD and a fifth node N5, and is turned on based on the third clock signal CLK3. The eighth switch 129 is coupled between the fifth node N5 and the first node N1, and is turned on based on the fourth clock signal CLK4. The fourth capacitor 131 is coupled between the fifth node N5 and the ground voltage GND.

The time duration during which the third clock signal CLK3 is activated and a time duration during which the fourth clock signal CLK4 is activated are separated. For example, the time duration during which the third clock signal CLK3 is activated does not overlap the time duration during which the fourth clock signal CLK4 is activated. Therefore, the seventh switch 128 and the eighth switch 129 may be alternately turned on with the second frequency.

Therefore, in a way similar to the switched capacitor circuit 110*b*, the resistor circuit 120*b*-4 may provide a resistance corresponding to (1/(C4\*f2)) between the supply voltage VDD and the first node N1, where C4 represents a capacitance of the fourth capacitor 131 and f2 represents the second frequency. Thus, the resistor circuit 120*b*-4 may provide a resistance, which is varied based on the second frequency, between the supply voltage VDD and the first node N1.

As described above, the switched capacitor circuit 110*b* may operate as a resistor having a resistance inversely proportional to the first frequency of the first clock signal CLK1 and the second clock signal CLK2. Therefore, as the first frequency increases, the magnitude of the first voltage V1 generated by the voltage divider 100*b*-4 may decrease. On the other hand, as the first frequency decreases, the magnitude of the first voltage V1 generated by the voltage divider 100*b*-4 may increase.

In addition, the voltage divider 100*b*-4 of FIG. 13 includes the resistor circuit 120*b*-4 having a resistance varied based on the second frequency of the third clock signal CLK3 and the fourth clock signal CLK4. As a result, the voltage divider 100*b*-4 may control the range of magnitude of the first voltage V1, which is varied based on the first frequency, by varying the resistance of the resistor circuit 120*b*-4 based on the second frequency of the third clock signal CLK3 and the fourth clock signal CLK4.

Referring again to FIG. 9, the filter 200 may perform a low-pass filtering operation on the first voltage V1, received from the voltage divider 100*b* through the first node N1, to generate the body bias voltage Vb.

As illustrated in FIG. 9, the body bias voltage Vb generated by the body bias voltage generator 10*b* may be provided to an n-type body 41 on which a p-type metal oxide semiconductor (PMOS) transistor 40 is formed.

As described with reference to FIG. 20, the body bias voltage generator 10*b* may further include a buffer that buffers the body bias voltage Vb generated by the filter 200. In this case, the body bias voltage Vb output from the buffer may be provided to the n-type body 41 on which the PMOS transistor 40 is formed.

As described with reference to FIGS. 9 to 13, as the first frequency of the first clock signal CLK1 and the second clock signal CLK2 increases, the magnitude of the body bias voltage Vb generated by the body bias voltage generator 10*b* may decrease. On the other hand, as the first frequency of the first clock signal CLK1 and the second clock signal CLK2 decreases, the magnitude of the body bias voltage Vb generated by the body bias voltage generator 10*b* may increase.

When the body bias voltage Vb (which is applied to the n-type body 41 on which the PMOS transistor 40 is formed) decreases, the threshold voltage of the PMOS transistor 40 may decrease. When the body bias voltage Vb applied to the n-type body 41 increases, the threshold voltage of the PMOS transistor 40 may increase.

When the threshold voltage of the PMOS transistor 40 decreases, the operational speed of the PMOS transistor 40 may increase because the signal transfer delay time of the PMOS transistor 40 decreases. On the other hand, when the threshold voltage of the PMOS transistor 40 increases, leakage current flowing between the source and drain of the PMOS transistor 40 in a cutoff state may decrease.

Therefore, when the first frequency of the first clock signal CLK1 and the second clock signal CLK2 increases, the body bias voltage generator 10*b* may increase the operational speed of the PMOS transistor 40. This may be accomplished by decreasing the magnitude of the body bias voltage Vb applied to the n-type body 41 on which the PMOS transistor 40 is formed. As a result, the threshold voltage of the PMOS transistor 40 may decrease. When the first frequency of the first clock signal CLK1 and the second clock signal CLK2 decreases, the body bias voltage generator 10*b* may decrease the leakage current of the PMOS transistor 40. This may be accomplished by increasing the magnitude of the body bias voltage Vb applied to the n-type body 41 on which the PMOS transistor 40 is formed. As a result, the threshold voltage of the PMOS transistor 40 may increase.

In addition, since the body bias voltage generator 10*b* is implemented using the switched capacitor circuit 110*b*, which has a simple structure, the size of the body bias voltage generator 10*b* may be reduced.

Figure 14:
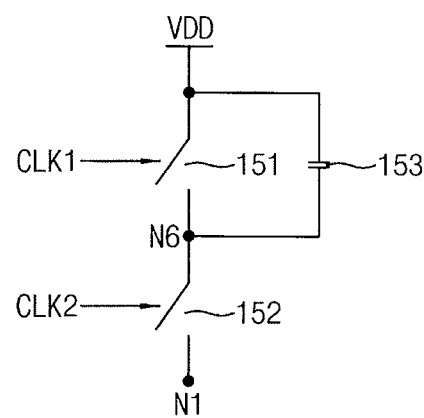
FIGS. 14, 15 and 16 illustrate examples of a switched capacitor circuit.
Figure 15:
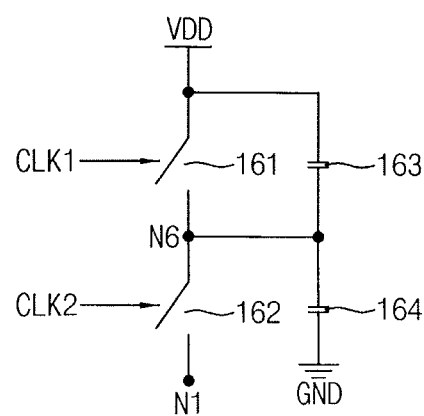
Figure 16:
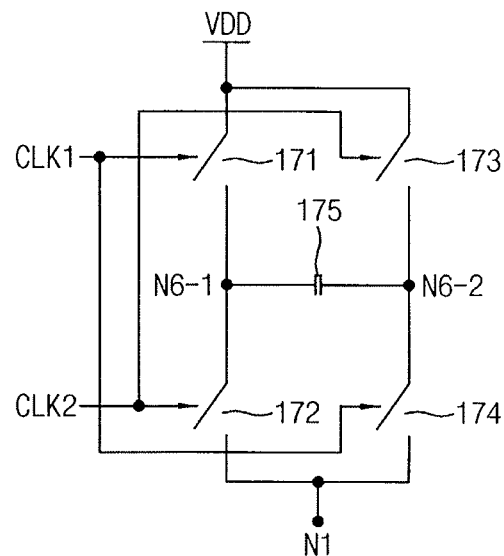

FIGS. 14, 15 and 16 illustrate examples of a switched capacitor circuit which may be included in the body bias voltage generator 10*a* of FIG. 4. Referring to FIG. 14, a switched capacitor circuit 110*a*-1 includes switches 151 and 152 and a capacitor 153. The switch 151 is coupled between the supply voltage VDD and a node N6, and is turned on based on the first clock signal CLK1. The switch 152 is coupled between the node N6 and the first node N1, and is turned on based on the second clock signal CLK2. The capacitor 153 is coupled between the supply voltage VDD and the node N6.

Referring to FIG. 15, a switched capacitor circuit 110*a*-2 includes switches 161 and 162 and capacitors 163 and 164.

The switch 161 is coupled between the supply voltage VDD and a node N6, and is turned on based on the first clock signal CLK1. The switch 162 is coupled between the node N6 and the first node N1, and is turned on based on the second clock signal CLK2. The capacitor 163 is coupled between the supply voltage VDD and the node N6. The capacitor 164 is coupled between the node N6 and the ground voltage GND.

Referring to FIG. 16, a switched capacitor circuit 110a-3 includes switches 171, 172, 173, and 174 and a capacitor 175. The switch 171 is coupled between the supply voltage VDD and a node N6-1, and is turned on based on the first clock signal CLK1. The switch 172 is coupled between the node N6-1 and the first node N1, and is turned on based on the second clock signal CLK2. The switch 173 is coupled between the supply voltage VDD and a node N6-2, and is turned on based on the second clock signal CLK2. The switch 174 is coupled between the node N6-2 and the first node N1, and is turned on based on the first clock signal CLK1. The capacitor 175 is coupled between the node N6-1 and the node N6-2.

In a way similar to the switched capacitor circuit 110a of FIG. 5, each of the switched capacitor circuits 110a-1, 110a-2, and 110a-3 of FIGS. 14, 15, and 16 may operate as a resistor having a resistance inversely proportional to the first frequency of the first clock signal CLK1 and the second clock signal CLK2. In another embodiment, the switched capacitor circuit 110a may have a different structure.

Figure 17:
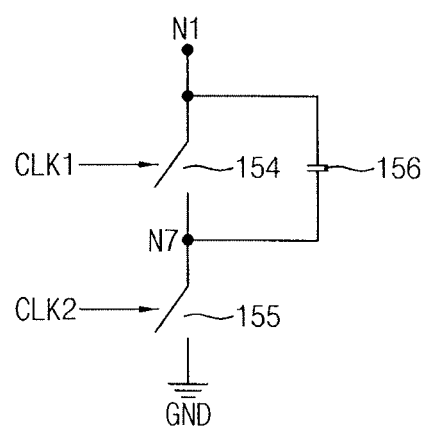
FIGS. 17, 18 and 19 illustrate other examples of a switched capacitor circuit.
Figure 18:
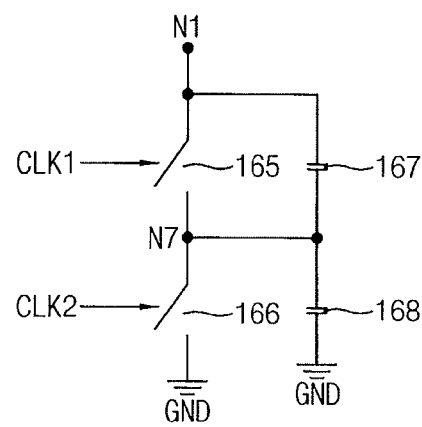
Figure 19:
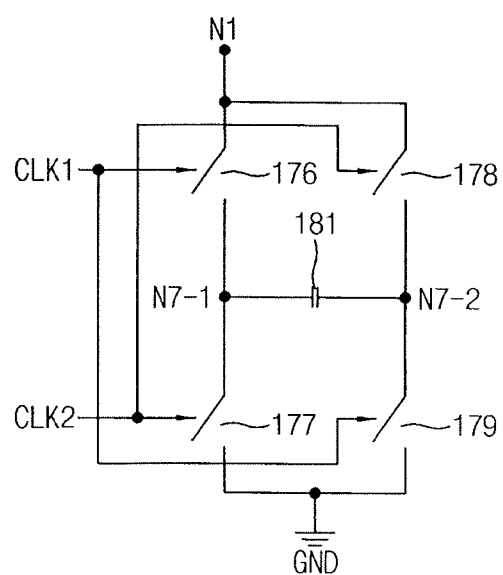

FIGS. 17, 18, and 19 illustrate examples of a switched capacitor circuit which may be included in the body bias voltage 10b generator of FIG. 9. Referring to FIG. 17, a switched capacitor circuit 110b-1 includes switches 154 and 155 and a capacitor 156. The switch 154 is coupled between the first node N1 and a node N7, and is turned on based on the first clock signal CLK1. The switch 155 is coupled between the node N7 and the ground voltage GND, and is turned on based on the second clock signal CLK2. The capacitor 156 is coupled between the first node N1 and the node N7.

Referring to FIG. 18, a switched capacitor circuit 110b-2 includes switches 165 and 166 and capacitors 167 and 168. The switch 165 is coupled between the first node N1 and a node N7, and is turned on based on the first clock signal CLK1. The switch 166 is coupled between the node N7 and the ground voltage GND, and is turned on based on the second clock signal CLK2. The capacitor 167 is coupled between the first node N1 and the node N7. The capacitor 168 is coupled between the node N7 and the ground voltage GND.

Referring to FIG. 19, a switched capacitor circuit 110b-3 includes switches 176, 177, 178, and 179 and a capacitor 181. The switch 176 is coupled between the first node N1 and a node N7-1, and is turned on based on the first clock signal CLK1. The switch 177 is coupled between the node N7-1 and the ground voltage GND, and is turned on based on the second clock signal CLK2. The switch 178 is coupled between the first node N1 and a node N7-2, and is turned on based on the second clock signal CLK2. The switch 179 is coupled between the node N7-2 and the ground voltage GND, and is turned on based on the first clock signal CLK1. The capacitor 181 is coupled between the node N7-1 and the node N7-2.

In a way similar to the switched capacitor circuit 110b of FIG. 10, each of the switched capacitor circuits 110b-1, 110b-2, and 110b-3 of FIGS. 17, 18 and 19 may operate as a resistor having a resistance inversely proportional to the first frequency of the first clock signal CLK1 and the second clock signal CLK2. In another embodiment, the switched capacitor circuit 110b may have a different structure.

Figure 20:
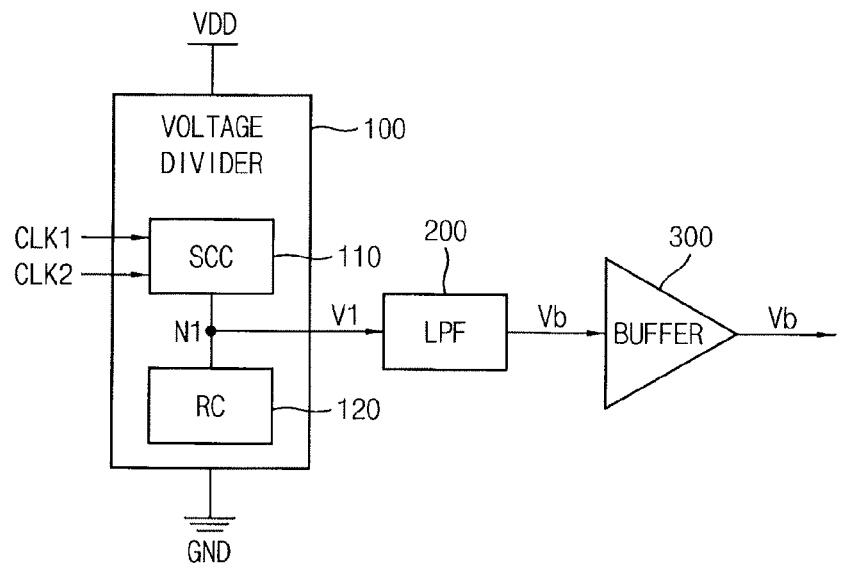
FIG. 20 illustrates another embodiment of a body bias voltage generator.

FIG. 20 illustrates another embodiment of the body bias voltage generator 11 of FIG. 1. Referring to FIG. 20, the body bias voltage generator 11 includes a voltage divider 100, a filter LPF 200, and a buffer 300. The body bias voltage generator 11 is the same as the body bias voltage generator 10 of FIG. 1, except that the body bias voltage generator 11 of FIG. 20 further includes the buffer 300.

The buffer 300 may buffer the body bias voltage Vb generated by the filter 200. When the body bias voltage Vb is directly applied from the filter 200 to a body of a MOS transistor (e.g., in an arrangement that does not include buffer 300), the filtering characteristic of the filter 200 may be altered because of a resistance element of the body. However, in the embodiment of FIG. 20, the buffer 300 buffers the body bias voltage Vb generated by the filter 200 and then provides the body bias voltage Vb to the body of the MOS transistor. Since the filter 200 is isolated from the body of the MOS transistor by the buffer 300, the filter 200 may maintain the filtering characteristic although the body bias voltage Vb is applied from the buffer 300 to the body of the MOS transistor.

Figure 21:
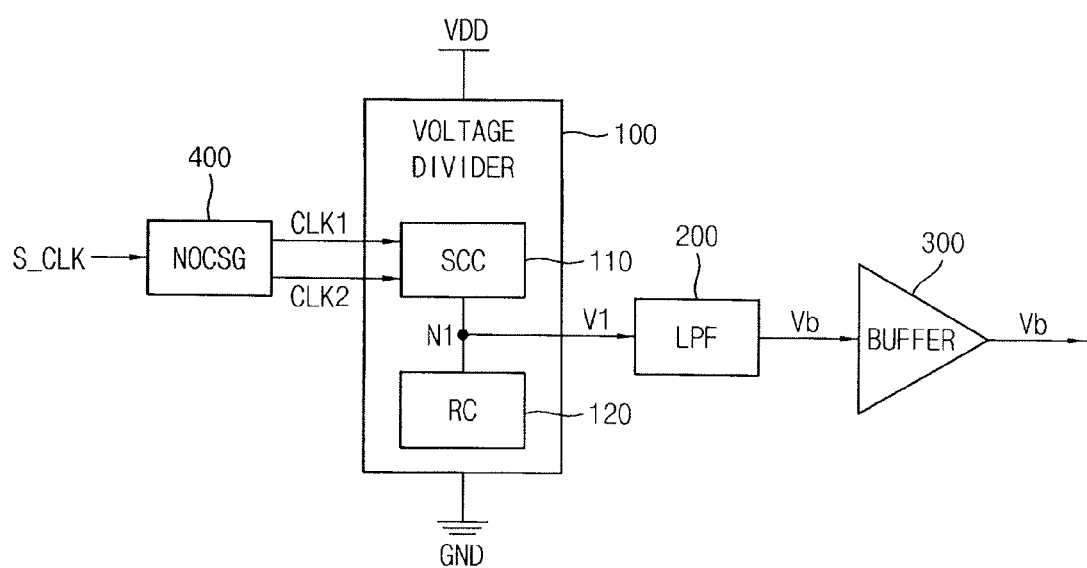
FIG. 21 illustrates another embodiment of a body bias voltage generator.

FIG. 21 illustrates another embodiment of the body bias voltage generator 12 of FIG. 1. Referring to FIG. 21, the body bias voltage generator 12 includes a voltage divider 100, a filter LPF 200, a buffer 300, and a non-overlapping clock signal generator NOCSG 400. The body bias voltage generator 12 of FIG. 21 is the same as the body bias voltage generator 11 of FIG. 20, except that the body bias voltage generator 12 of FIG. 21 further includes the non-overlapping clock signal generator 400.

The non-overlapping clock signal generator 400 may receive a system clock signal S_CLK having the first frequency. The non-overlapping clock signal generator 400 may generate the first clock signal CLK1 and the second clock signal CLK2, both of which have the first frequency, based on the system clock signal S_CLK. The time duration when the first clock signal CLK1 is activated does not overlap the time duration when the second clock signal CLK2 is activated. For example, the non-overlapping clock signal generator 400 may generate the first clock signal CLK1 and the second clock signal CLK2 by adjusting a duty ratio of the system clock signal S_CLK.

The first clock signal CLK1 and the second clock signal CLK2 generated by the non-overlapping clock signal generator 400 may be provided to the switched capacitor circuit 110 in the voltage divider 100. Therefore, the body bias voltage generator 12 may vary the magnitude of the body bias voltage Vb based on the first frequency of the system clock signal S_CLK.

Figure 22:
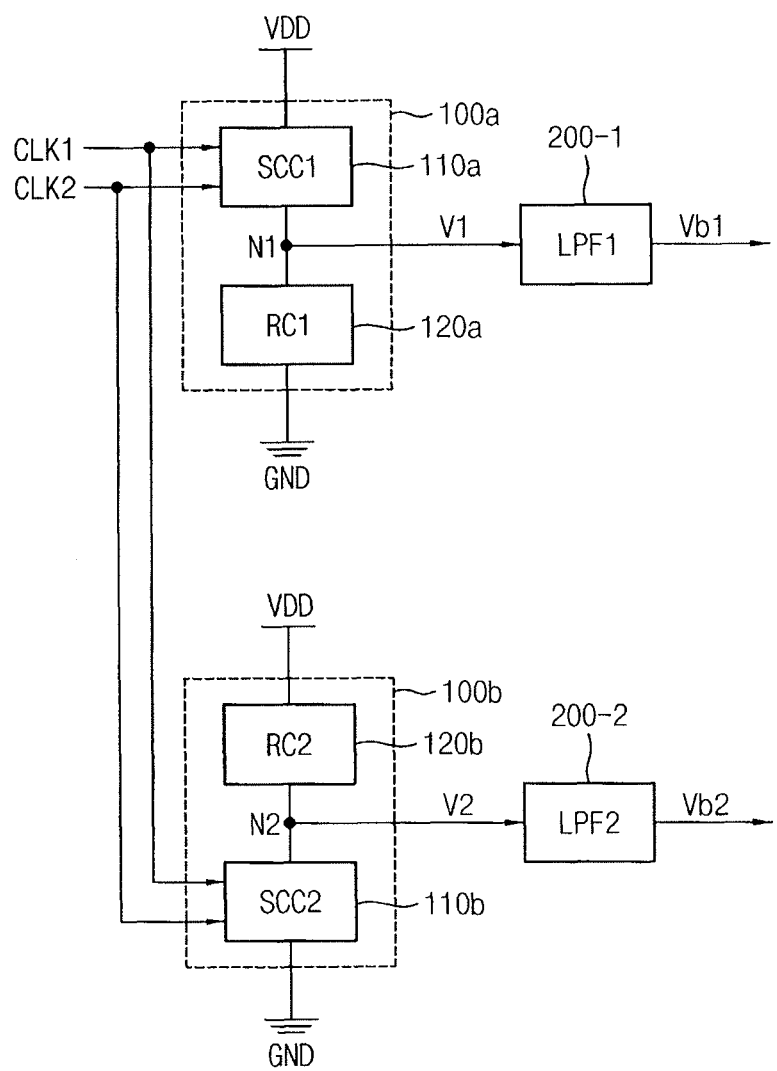
FIG. 22 illustrates another embodiment of a body bias voltage generator.

FIG. 22 illustrates another embodiment of a body bias voltage generator 20, which, for example, may be included in a system-on-chip. Referring to FIG. 22, the body bias voltage generator 20 includes a first voltage divider 100a, a first filter LPF1 200-1, a second voltage divider 100b, and a second filter LPF2 200-2.

The first voltage divider 100a is coupled between a supply voltage VDD and a reference (e.g., ground) voltage GND. The first voltage divider 100a includes a first switched capacitor circuit SCC1 110a and a first resistor circuit RC1 120a. The first switched capacitor circuit SCC1 110a is coupled between the supply voltage VDD and a first node N1. The first resistor circuit RC1 120a is coupled between the first node N1 and the ground voltage GND.

The first switched capacitor circuit 110a operates based on a first clock signal CLK1 and a second clock signal CLK2, both of which have a first frequency. A time duration during which the first clock signal CLK1 is activated and a time duration during which the second clock signal CLK2 is activated are separated. For example, the time duration during which the first clock signal CLK1 is activated does not overlap the time duration during which the second clock signal CLK2 is activated.

The first voltage divider 100a outputs a first voltage V1, which is lower than the supply voltage VDD, through the first node N1. This may be accomplished by dividing the supply voltage VDD based on a ratio of a resistance of the first switched capacitor circuit 110a and a resistance of the first resistor circuit 120a.

The first switched capacitor circuit 110a may operate as a resistor having a resistance inversely proportional to the first frequency of the first clock signal CLK1 and the second clock signal CLK2. According to example embodiments, the first resistor circuit 120a may have a substantially constant resistance or a variable resistance. Therefore, as the first frequency increases, the first voltage divider 100a may increase the magnitude of the first voltage V1. On the other hand, as the first frequency decreases, the first voltage divider 100a may decrease the magnitude of the first voltage V1.

The first voltage divider 100a in the body bias voltage generator 20 of FIG. 22 may be implemented with the voltage divider 100a in the body bias voltage generator 10a of FIG. 4.

The second voltage divider 100b is coupled between the supply voltage VDD and the ground voltage GND. The second voltage divider 100b includes a second switched capacitor circuit SCC2 110b and a second resistor circuit RC2 120b. The second switched capacitor circuit SCC2 110b is coupled between a second node N2 and the ground voltage GND. The second resistor circuit RC2 120b is coupled between the supply voltage VDD and the second node N2.

The second switched capacitor circuit 110b operates based on the first clock signal CLK1 and the second clock signal CLK2, both of which have the first frequency.

The second voltage divider 100b outputs a second voltage V2, which is lower than the supply voltage VDD, through the second node N2. This may be accomplished by dividing the supply voltage VDD based on a ratio of a resistance of the second switched capacitor circuit 110b and a resistance of the second resistor circuit 120b.

The second switched capacitor circuit 110b may operate as a resistor having a resistance inversely proportional to the first frequency of the first clock signal CLK1 and the second clock signal CLK2. According to example embodiments, the second resistor circuit 120b may have a substantially constant resistance or a variable resistance. Therefore, as the first frequency increases, the second voltage divider 100b may decrease the magnitude of the second voltage V2. On the other hand, as the first frequency decreases, the second voltage divider 100b may increase the magnitude of the second voltage V2.

The second voltage divider 100b in the body bias voltage generator 20 of FIG. 22 may be implemented with the voltage divider 100b in the body bias voltage generator 10b of FIG. 9.

The first filter 200-1 performs a filtering operation on the first voltage V1 received from the first voltage divider 100a through the first node N1 to generate a first body bias voltage Vb1. In some example embodiments, the first filter 200-1 may be a low-pass filter. Therefore, the first filter 200-1 may perform a low-pass filtering operation on the first voltage V1, received from the first voltage divider 100a through the first node N1, to generate the first body bias voltage Vb1.

The second filter 200-2 performs a filtering operation on the second voltage V2 received from the second voltage divider 100b through the second node N2 to generate a second body bias voltage Vb2. In some example embodiments, the second filter 200-2 may be a low-pass filter. Therefore, the second filter 200-2 may perform a low-pass filtering operation on the second voltage V2, received from the second voltage divider 100b through the second node N2, to generate the second body bias voltage Vb2.

The first filter 200-1 and the second filter 200-2 in the body bias voltage generator 20 of FIG. 22 may be implemented with the filter 200 in the body bias voltage generator 10 of FIG. 1.

As described with reference to the embodiments in FIGS. 1 to 22, when the first frequency of the first clock signal CLK1 and the second clock signal CLK2 increases, the body bias voltage generator 20 may increase a magnitude of the first body bias voltage Vb1 and decrease a magnitude of the second body bias voltage Vb2. On the other hand, when the first frequency of the first clock signal CLK1 and the second clock signal CLK2 decreases, the body bias voltage generator 20 may decrease the magnitude of the first body bias voltage Vb1 and increase the magnitude of the second body bias voltage Vb2.

Figure 23:
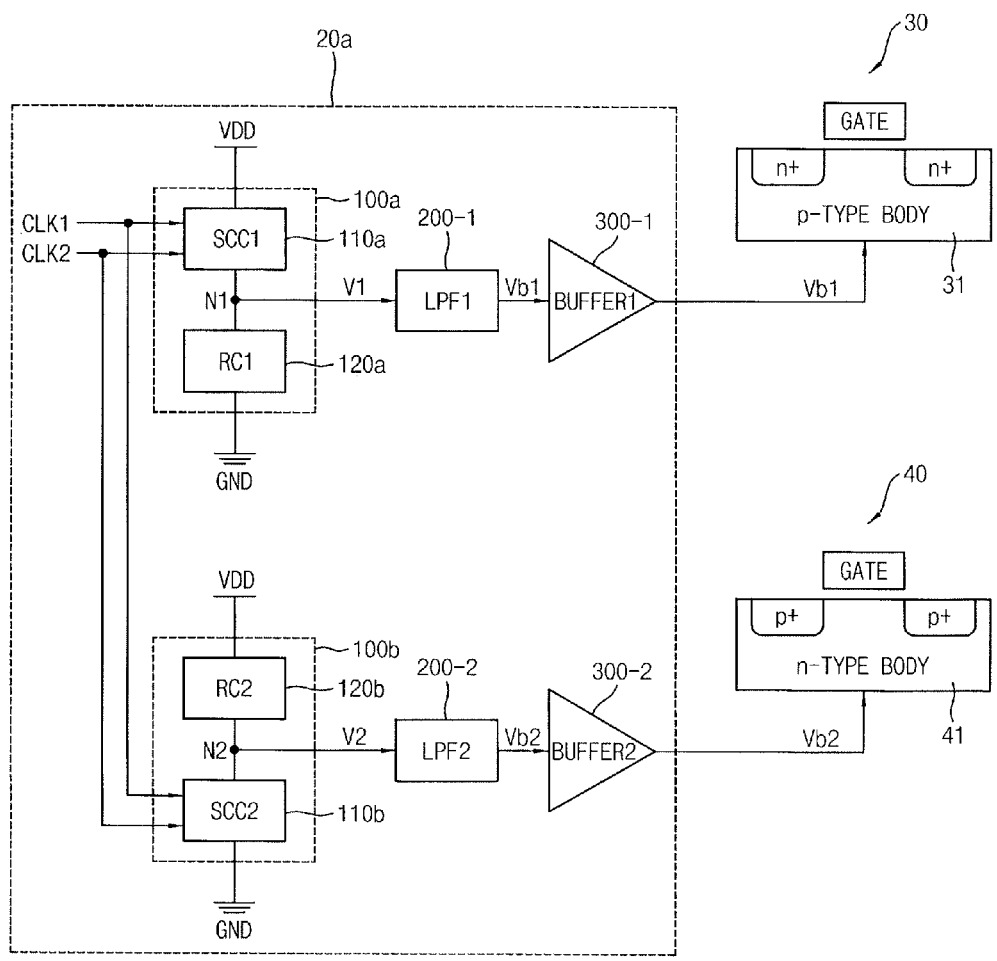
FIG. 23 illustrates another embodiment of a body bias voltage generator.

FIG. 23 illustrates another embodiment of a body bias voltage generator 20a of FIG. 22. Referring to FIG. 23, the body bias voltage generator 20a includes a first voltage divider 100a, a first filter LPF1 200-1, a second voltage divider 100b, a second filter LPF2 200-2, a first buffer 300-1, and a second buffer 300-2. The body bias voltage generator 20a of FIG. 23 is the same as the body bias voltage generator 20 of FIG. 22, except that the body bias voltage generator 20a of FIG. 23 further includes the first buffer 300-1 and the second buffer 300-2.

The first buffer 300-1 may buffer the first body bias voltage Vb1 generated by the first filter 200-1, and output the first body bias voltage Vb1. The second buffer 300-2 may buffer the second body bias voltage Vb2 generated by the second filter 200-2, and output the second body bias voltage Vb2.

As illustrated in FIG. 23, the first body bias voltage Vb1 output from the first filter 200-1 may be provided to a p-type body 31 on which an NMOS transistor 30 is formed. The second body bias voltage Vb2 output from the second filter 200-2 may be provided to an n-type body 41 on which a PMOS transistor 40 is formed.

Therefore, when the first frequency of the first clock signal CLK1 and the second clock signal CLK2 increases, the body bias voltage generator 20a may increase the operational speed of the NMOS transistor 30 and the PMOS transistor 40 by increasing the magnitude of the first body bias voltage Vb1 (which is applied to the p-type body 31 on which the NMOS transistor 30 is formed) and decreasing the magnitude of the second body bias voltage Vb2 (which is applied to the n-type body 41 on which the PMOS transistor 40 is formed). As a result, the threshold voltage of the NMOS transistor 30 and the PMOS transistor 40 may be decreased.

On the other hand, when the first frequency of the first clock signal CLK1 and the second clock signal CLK2 decreases, the body bias voltage generator 20a may decrease the leakage current of the NMOS transistor 30 and the PMOS transistor 40. This may be accomplished by decreasing the magnitude of the first body bias voltage Vb1 (which is applied to the p-type body 31 on which the NMOS transistor 30 is formed) and increasing the magnitude of the second body bias voltage Vb2 (which is applied to the n-type body 41 on which the PMOS transistor 40 is formed). As a result, the threshold voltage of the NMOS transistor 30 and the PMOS transistor 40 may be increased.

Figure 24:
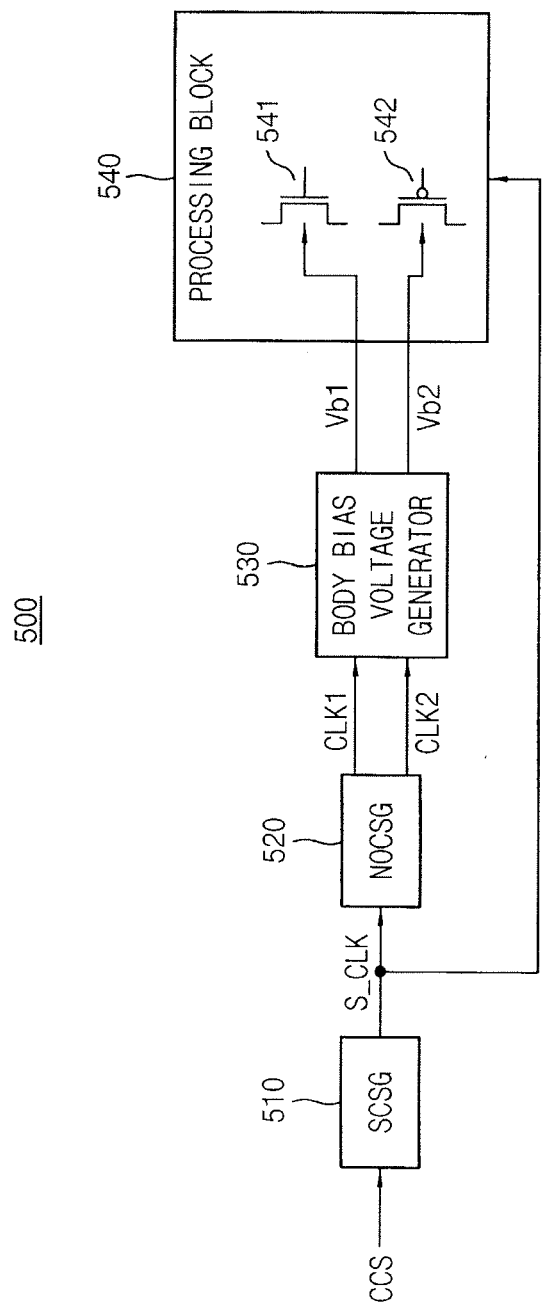
FIG. 24 illustrates an embodiment of a system-on-chip.

FIG. 24 illustrates an embodiment of a system-on-chip 500 which includes a system clock signal generator SCSG 510, a non-overlapping clock signal generator NOCSG 520, a body bias voltage generator 530, and a processing block 540.

The system clock signal generator 510 generates a system clock signal S_CLK having a first frequency. The system clock signal generator 510 may adjust the first frequency of the system clock signal S_CLK based on a clock control signal CCS. The system clock signal generator 510 may provide the system clock signal S_CLK to the non-overlapping clock signal generator 520 and the processing block 540.

The non-overlapping clock signal generator 520 generates a first clock signal CLK1 and a second clock signal CLK2, both of which have the first frequency. The first and second clock signals CLK1 and CLK2 are generated based on the system clock signal S_CLK, such that a time duration during which the first clock signal CLK1 is activated does not overlap a time duration during which the second clock signal CLK2 is activated.

The body bias voltage generator 530 is coupled between a supply voltage and a ground voltage. The body bias voltage generator 530 generates a first body bias voltage Vb1 and a second body bias voltage Vb2. The first body bias voltage Vb1 has a magnitude proportional to the first frequency. The second body bias voltage Vb2 has a magnitude inversely proportional to the first frequency. The first and second body bias voltages Vb1 and Vb2 are generated using a switched capacitor operating based on the first clock signal CLK1 and the second clock signal CLK2.

The body bias voltage generator 530 in the system-on-chip 500 of FIG. 24 may be implemented with the body bias voltage generator 20 of FIG. 22.

The processing block 540 includes at least one NMOS transistor 541 and at least one PMOS transistor 542. The at least one NMOS transistor 541 has a threshold voltage that is varied based on the first body bias voltage Vb1. The at least one PMOS transistor 542 has a threshold voltage that is varied based on the second body bias voltage Vb2.

Figure 25:
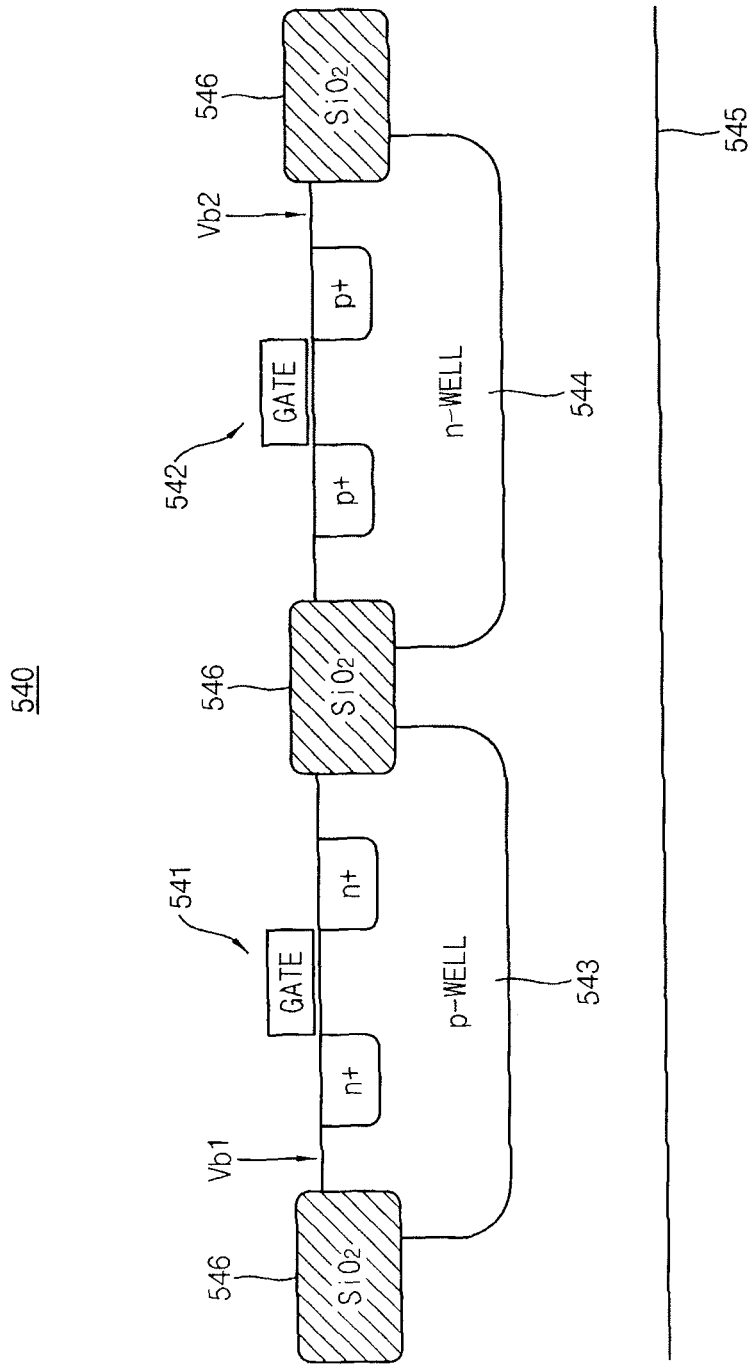
FIG. 25 illustrates an example of a processing block in the system-on-chip.

FIG. 25 illustrates an example of a part of a processing block in the system-on-chip of FIG. 24. Referring to FIG. 25, the processing block 540 includes at least one p-well 543 and at least one n-well 544 formed on a substrate 545. The at least one p-well 543 and the at least one n-well 544 are separated from each other by an element isolation area 546. The element isolation area 546 may include, for example, silicon dioxide (SiO$_2$) or another insulating material. The at least one NMOS transistor 541 may be formed on the at least one p-well 543, and the at least one PMOS transistor 542 may be formed on the at least one n-well 544.

The first body bias voltage Vb1 generated by the body bias voltage generator 530 may be applied to the at least one p-well 543 on which the at least one NMOS transistor 541 is formed. The second body bias voltage Vb2 generated by the body bias voltage generator 530 may be applied to the at least one n-well 544 on which the at least one PMOS transistor 542 is formed.

Therefore, when the first frequency of the first clock signal CLK1 and the second clock signal CLK2 increases, the body bias voltage generator 530 may increase the operational speed of the at least one NMOS transistor 541 and the at least one PMOS transistor 542. This may be accomplished by increasing the magnitude of the first body bias voltage Vb1 (which is applied to the p-well 543 on which the at least one NMOS transistor 541 is formed) and decreasing the magnitude of the second body bias voltage Vb2 (which is applied to the n-well 544 on which the at least one PMOS transistor 542 is formed). As a result, the threshold voltage of the at least one NMOS transistor 541 and the at least one PMOS transistor 542 may decrease.

On the other hand, when the first frequency of the first clock signal CLK1 and the second clock signal CLK2 decreases, the body bias voltage generator 530 may decrease the leakage current of the at least one NMOS transistor 541 and the at least one PMOS transistor 542. This may be accomplished by decreasing the magnitude of the first body bias voltage Vb1 (which is applied to the p-well 543 on which the at least one NMOS transistor 541 is formed) and increasing the magnitude of the second body bias voltage Vb2 (which is applied to the n-well 544 on which the at least one PMOS transistor 542 is formed). As a result, the threshold voltage of the at least one NMOS transistor 541 and the at least one PMOS transistor 542 may increase.

The structure of the processing block 540 illustrated in FIG. 25 is one example and may have a different structure in another embodiment.

The processing block 540 may operate in synchronization with the system clock signal S_CLK received from the system clock signal generator 510. The processing block 540 may perform various computing functions, such as executing specific software for performing specific calculations or tasks, in synchronization with the system clock signal S_CLK.

For example, the processing block 540 may be a microprocessor, a central process unit (CPU), a digital signal processor, or the like. In some example embodiments, the processing block 540 may include a single core or multiple cores. For example, the processing block 540 may be a multi-core processor, such as a dual-core processor, a quad-core processor, a hexa-core processor, etc. According to example embodiments, the processing block 540 may include an internal or external cache memory.

As described above with reference to FIGS. 24 and 25, when the first frequency of the system clock signal S_CLK increases, the body bias voltage generator 530 may decrease the threshold voltage of the at least one NMOS transistor 541 and the at least one PMOS transistor 542. This may be accomplished by increasing the magnitude of the first body bias voltage Vb1 and decreasing the magnitude of the second body bias voltage Vb2. Therefore, the operational speed of the system-on-chip 500 may increase.

On the other hand, when the first frequency of the system clock signal S_CLK decreases, the body bias voltage generator 530 may increase the threshold voltage of the at least one NMOS transistor 541 and the at least one PMOS transistor 542. This may be accomplished by decreasing the magnitude of the first body bias voltage Vb1 and increasing the magnitude of the second body bias voltage Vb2. Therefore, leakage current of the system-on-chip 500 may decrease.

Figure 26:
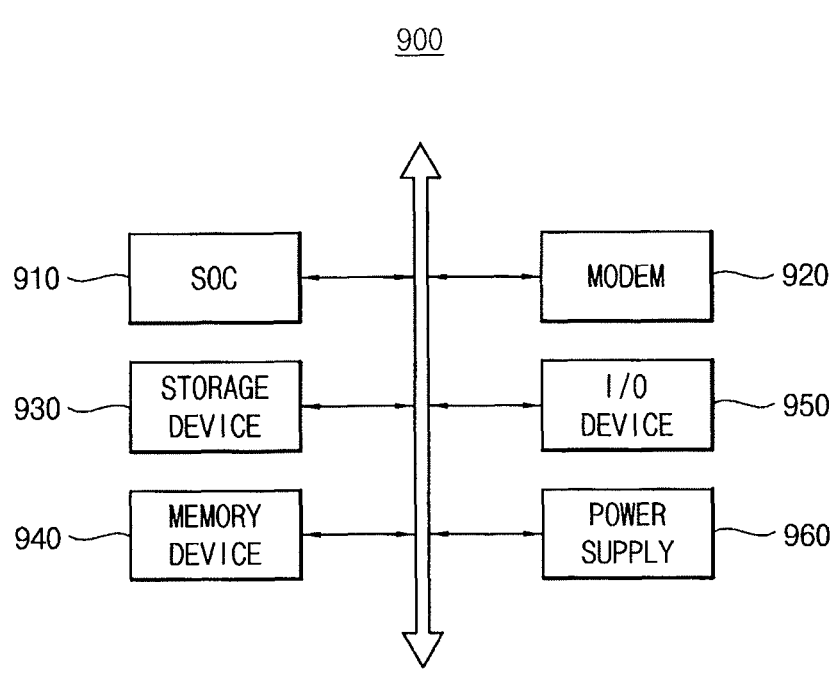
FIG. 26 illustrates an embodiment of a computing system.

FIG. 26 illustrates an embodiment of a computing system 900 which includes a system-on-chip SOC 910, a modem 920, a storage device 930, a memory device 940, an input/output device 950, and a power supply 960. The system-on-chip 910 controls overall operations of the computing system 900.

The system-on-chip 910 may include at least one NMOS transistor and at least one PMOS transistor. The system-onchip 910 may control a threshold voltage of the at least one NMOS transistor and a threshold voltage of the at least one PMOS transistor by adjusting a magnitude of a body bias voltage of the at least one NMOS transistor and a magnitude of a body bias voltage of the at least one PMOS transistor based on an operational frequency.

For example, when the operational frequency increases, the system-on-chip 910 may increase an operation speed of the system-on-chip 910 by adjusting the magnitude of the body bias voltage to decrease a threshold voltage of the at least one NMOS transistor and a threshold voltage of the at least one PMOS transistor. On the other hand, when the operational frequency decreases, the system-on-chip 910 may decrease the leakage current of the system-on-chip 910 by adjusting the magnitude of the body bias voltage to increase the threshold voltage of the at least one NMOS transistor and the threshold voltage of the at least one PMOS transistor.

The system-on-chip 910 in the computing system 900 may be implemented with the system-on-chip 500 of FIG. 24.

The modem 920 communicates data with an external device through a wired or wireless communication.

The storage device 930 stores data received from the external device through the modem 920 and data to be transferred to the external device through the modem 920. The storage device 930 may include a non-volatile memory device such as a flash memory device, a solid state drive (SSD), a hard disk drive (HDD), etc.

The memory device 940 stores data required for an operation of the computing system 900. The memory device 940 may include a dynamic random access memory (DRAM), a static random access memory (SRAM), or a non-volatile memory, such as an erasable programmable read-only memory (EPROM), an electrically erasable programmable read-only memory (EEPROM), a flash memory, etc.

The input/output device 950 may include a touch screen, a keypad, a keyboard, a mouse, a printer, etc. The power supply 960 may supply operational power.

The computing system 900 may further include one or more ports that communicate, for example, with a video card, a sound card, a memory card, a universal serial bus (USB) device, or other electronic devices.

The system-on-chip 910 may communicate with the storage device 930, the memory device 940, and the input/output device 950 via an address bus, a control bus, and/or a data bus. In some example embodiments, the system-on-chip 910 may be coupled to an extended bus such as a peripheral component interconnection (PCI) bus.

The computing system 900 may be any computing system including the system-on-chip 910. For example, the computing system 900 may include a digital camera, a mobile phone, a smart phone, a laptop computer, a portable multimedia player (PMP), a personal digital assistant (PDA), etc.

The computing system 900 and/or components of the computing system 900 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A system-on-chip, comprising:
a body bias voltage generator which includes:
a voltage divider coupled between a supply voltage and a reference voltage, the voltage divider including a switched capacitor circuit to operate based on a first clock signal and a second clock signal and a resistor circuit, the voltage divider to output a first voltage through a first node coupled to the switched capacitor circuit and the resistor circuit, the first clock signal and a second clock signal to have a first frequency; and
a filter to perform a filtering operation on the first voltage to generate a body bias voltage, wherein the filter is to output a first body bias voltage when the switch capacitor circuit is set to a first resistance value and a second body bias voltage when the switch capacitor circuit is set to a second resistance value, the first and second body bias voltages corresponding to different operational frequencies of a system.

2. The system-on-chip as claimed in claim 1, wherein the voltage divider is to:
increase a magnitude of the first voltage as the first frequency increases, and
decrease the magnitude of the first voltage as the first frequency decreases.

3. The system-on-chip as claimed in claim 1, wherein:
the switched capacitor circuit is coupled between the supply voltage and the first node, and
the resistor circuit is coupled between the first node and the reference voltage.

4. The system-on-chip as claimed in claim 3, wherein the body bias voltage is to be coupled to a p-type body on which an n-type metal oxide semiconductor transistor is formed.

5. The system-on-chip as claimed in claim 3, wherein the switched capacitor circuit includes:
a first switch coupled between the supply voltage and a second node, the first switch to be turned on based on the first clock signal;
a second switch coupled between the second node and the first node, the second switch to be turned on based on the second clock signal; and
a capacitor coupled between the second node and the ground voltage.

6. The system-on-chip as claimed in claim 3, wherein the resistor circuit includes:
first through n-th sub resistors coupled in series between the first node and the ground voltage, n being a positive integer; and
first through n-th sub switches coupled to the first through n-th sub resistors, respectively, in parallel, the first through n-th sub switches to be turned on based on first through n-th resistor control signals, respectively.

7. The system-on-chip as claimed in claim 3, wherein the resistor circuit includes:
a first switch coupled between the first node and a second node, the first switch to be turned on based on the third clock signal;
a second switch coupled between the second node and the ground voltage, the second switch to be turned on based on the fourth clock signal; and
a capacitor coupled between the second node and the ground voltage.

8. The system-on-chip as claimed in claim 1, wherein the voltage divider is to:
decrease a magnitude of the first voltage as the first frequency increases, and
increase the magnitude of the first voltage as the first frequency decreases.

9. The system-on-chip as claimed in claim 1, wherein:
the switched capacitor circuit is coupled between the first node and the ground voltage, and
the resistor circuit is coupled between the supply voltage and the first node.

10. The system-on-chip as claimed in claim 9, wherein the body bias voltage is to be coupled to an n-type body on which a p-type metal oxide semiconductor (PMOS) transistor is formed.

11. The system-on-chip as claimed in claim 9, wherein the switched capacitor circuit includes:
a first switch coupled between the first node and a second node, the first switch to be turned on based on the first clock signal;
a second switch coupled between the second node and the ground voltage, the second switch to be turned on based on the second clock signal; and
a capacitor coupled between the second node and the ground voltage.

12. The system-on-chip as claimed in claim 9, wherein the resistor circuit includes:
first through n-th sub resistors coupled in series between the supply voltage and the first node, n being a positive integer; and
first through n-th sub switches coupled to the first through n-th sub resistors, respectively, in parallel, the first through n-th sub switches to be turned on based on first through n-th resistor control signals, respectively.

13. The system-on-chip as claimed in claim 9, wherein the resistor circuit includes:
a first switch coupled between the supply voltage and a second node, the first switch to be turned on based on the third clock signal;
a second switch coupled between the second node and the first node, the second switch to be turned on based on the fourth clock signal; and
a capacitor coupled between the second node and the ground voltage.

14. The system-on-chip as claimed in claim 1, further comprising:
a buffer to buffer the body bias voltage generated by the filter and to output the body bias voltage.

15. The system-on-chip as claimed in claim 1, wherein a resistance of the resistor circuit is to be varied based on a resistor control signal.

16. A system-on-chip, comprising:
a body bias voltage generator including:
a first switched capacitor circuit coupled between a supply voltage and a first node, the first switched capacitor circuit to operate based on a first clock signal and a second clock signal;
a first resistor circuit coupled between the first node and a ground voltage;
a first filter to perform a filtering operation on a first voltage received through the first node to generate a first body bias voltage;
a second resistor circuit coupled between the supply voltage and a second node;
a second switched capacitor circuit coupled between the second node and the ground voltage, the second switched capacitor circuit to operate based on the first clock signal and the second clock signal; and
a second filter to perform a filtering operation on a second voltage received through the second node to generate a second body bias voltage, wherein the first body bias voltage is to increase a threshold voltage of a transistor of a first conductivity type and the second body bias voltage is to decrease a threshold voltage of a transistor of a second conductivity type to set an operational speed of the system-on-chip.

17. A system-on-chip, comprising:
a system clock signal generator to generate a system clock signal having a first frequency based on a clock control signal;
a non-overlapping clock signal generator to generate a first clock signal and a second clock signal based on the system clock signal, the first clock signal and the second clock signal to have the first frequency, a time duration during which the first clock signal is activated to not overlap a time duration during which the second clock signal is activated;
a body bias voltage generator coupled between a supply voltage and a reference voltage, the body bias voltage generator to generate a first body bias voltage having a magnitude proportional to the first frequency and a second body bias voltage having a magnitude inversely proportional to the first frequency, the first and second bias voltages to be generated using a switched capacitor operating based on the first clock signal and the second clock signal; and
a processing block including at least one n-type metal oxide semiconductor transistor having a threshold voltage to vary based on the first body bias voltage and at least one p-type metal oxide semiconductor transistor having a threshold voltage to vary based on the second body bias voltage, wherein the first body bias voltage is to increase the threshold voltage of the n-type metal oxide semiconductor transistor and the second body bias voltage is to decrease the threshold voltage of the p-type metal oxide semiconductor transistor to set an operational speed of the system-on-chip.

18. The system-on-chip as claimed in claim 17, wherein the body bias voltage generator includes:
a first switched capacitor circuit coupled between the supply voltage and a first node, the first switched capacitor circuit to operate based on the first clock signal and the second clock signal;
a first resistor circuit coupled between the first node and the reference voltage;
a first filter to perform a filtering operation on a first voltage received through the first node to generate the first body bias voltage;
a second resistor circuit coupled between the supply voltage and a second node;
a second switched capacitor circuit coupled between the second node and the reference voltage, the second switched capacitor circuit to operate based on the first clock signal and the second clock signal; and a second filter to perform a filtering operation on a second voltage received through the second node to generate the second body bias voltage.

19. The system-on-chip as claimed in claim 17, wherein:
the processing block includes at least one p-well on a substrate and to receive the first body bias voltage, and at least one n-well on the substrate and to receive the second body bias voltage,
the at least one n-type metal oxide semiconductor transistor is on the at least one p-well, and
the at least one p-type metal oxide semiconductor transistor is on the at least one n-well.

20. The system-on-chip as claimed in claim 17, wherein the processing block operates in synchronization with the system clock signal.

* * * * *